US008923591B2

(12) United States Patent  
Gross

(10) Patent No.: US 8,923,591 B2  
(45) Date of Patent: Dec. 30, 2014

(54) METHOD AND DEVICE TO PROCESS COMPLEX IMAGE DATA

(75) Inventor: Patrick Gross, Langensendelbach (DE)

(73) Assignee: Siemens Aktiengesellschaft, Munich (DE)

( * ) Notice: Subject to any disclaimer, the term of this patent is extended or adjusted under 35 U.S.C. 154(b) by 225 days.

(21) Appl. No.: 13/403,415

(22) Filed: Feb. 23, 2012

(65) Prior Publication Data

US 2012/0224757 A1 Sep. 6, 2012

(30) Foreign Application Priority Data

Mar. 1, 2011 (DE) .......................... 10 2011 004 881

(51) Int. Cl.
*G06K 9/00* (2006.01)
*G01R 33/565* (2006.01)
*G01R 33/48* (2006.01)

(52) U.S. Cl.
CPC ...... *G01R 33/56563* (2013.01); *G01R 33/4828* (2013.01); *G01R 33/4804* (2013.01)
USPC .......................................... 382/131

(58) Field of Classification Search
CPC .................................................. G01R 33/20
See application file for complete search history.

(56) References Cited

U.S. PATENT DOCUMENTS

| | | | | |
|---|---|---|---|---|
| 5,144,235 A | * | 9/1992 | Glover et al. | 324/309 |
| 5,551,431 A | * | 9/1996 | Wells et al. | 600/410 |
| 6,483,308 B1 | | 11/2002 | Ma et al. | |
| 6,605,943 B1 | * | 8/2003 | Clark et al. | 324/309 |
| 6,856,134 B1 | * | 2/2005 | Reeder et al. | 324/309 |
| 7,227,359 B2 | | 6/2007 | Ma | |
| 2004/0032977 A1 | * | 2/2004 | Blezek et al. | 382/128 |
| 2004/0217760 A1 | * | 11/2004 | Madarasz et al. | 324/307 |
| 2008/0012566 A1 | * | 1/2008 | Pineda et al. | 324/309 |
| 2008/0240530 A1 | * | 10/2008 | Reese et al. | 382/131 |
| 2010/0260397 A1 | * | 10/2010 | Block et al. | 382/131 |

FOREIGN PATENT DOCUMENTS

WO WO 2008132686 A1 * 11/2008 ............. G01R 33/50

OTHER PUBLICATIONS

Son et al., Single-Point Dixon Water-Fat Imaging Using 64-Channel Single Echo Acquisition MRI, Concepts in Magnetic Resonance Part B: Magnetic Resonance Engineering, vol. 33B, Issue 3 (2008), pp. 152-162.

Ma, "A Single-Point Dixon Technique for Fat-Suppressed Fast 3D Gradient-Echo Imaging With a Flexible Echo Time," Journal of Magnetic Resonance Imaging, vol. 27 (2008), pp. 881-890.

(Continued)

*Primary Examiner* — Atiba O Fitzpatrick
*Assistant Examiner* — Carol Wang
(74) *Attorney, Agent, or Firm* — Schiff Hardin LLP

(57) ABSTRACT

Complex magnetic resonance (MR) image data, acquired from an examination subject that has at least two different spin species, are processed in a method and a device. At least one MR parameter that influences data acquired in an MR data acquisition is determined with spatial resolution. Complex image data are respectively acquired with each of multiple acquisition units in an MR data acquisition at multiple echo times, such that a phase difference between the first spin species and the second spin species is different at least two of the echo times. For multiple image points, a value of the at least one MR parameter is determined so that a function that depends on the at least one MR parameter and the corresponding image point in the complex image data satisfies an extreme condition.

18 Claims, 5 Drawing Sheets

(56) References Cited

OTHER PUBLICATIONS

Reeder et al., "Multicoil Dixon Chemical Species Separation With an Iterative Least-Squares Estimation Method," Magn. Reson. Med., vol. 51 (2004), pp. 35-45.

Chebrolu et al., "Noise Analysis for 3-Point Chemical Shift-Based Water-Fat Separation With Spectral Modeling of Fat," J. Magn. Reson. Imaging, vol. 32 (2010), pp. 493-500.

Yu et al., "Phase and Amplitude Correction for Multi-Echo Water-Fat Separation With Bipolar Acquisitions," J. Magn. Reson. Imaging, vol. 31 (2010), pp. 1264-1271.

Yin et al., "k-TE Generalized Autocalibrating Partially Parallel Acquisition (GRAPPA) for Accelerated Multiple Gradient-Recalled Echo (MGRE) R2* Mapping in the Abdomen", Magnetic Resonance in Medicine, vol. 61 (2009), pp. 507-516.

\* cited by examiner

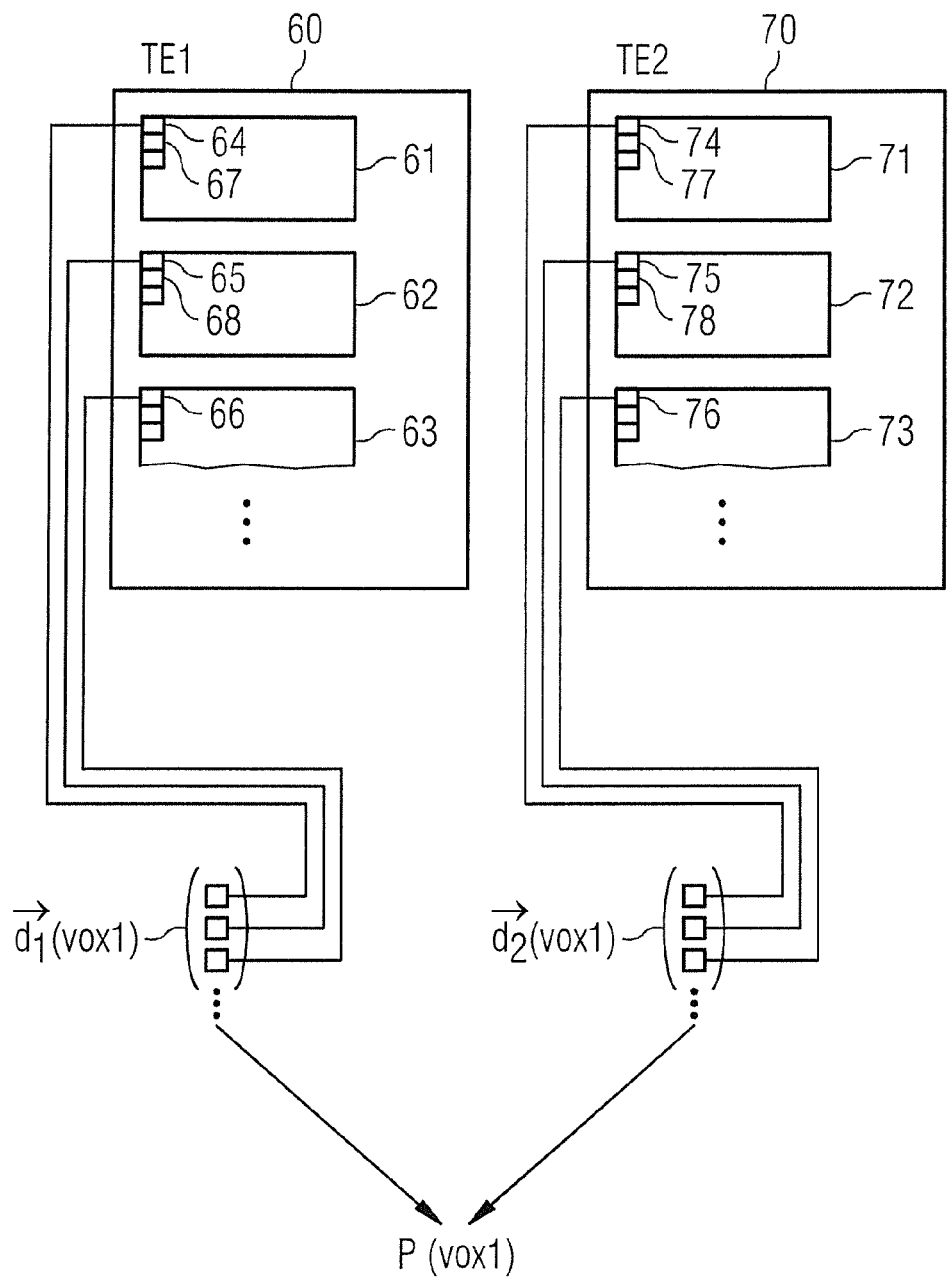

METHOD AND DEVICE TO PROCESS COMPLEX IMAGE DATA

BACKGROUND OF THE INVENTION

1. Field of the Invention

The present invention concerns a method and a device to process complex image data (i.e., data having a real part and an imaginary part) of an examination subject in a magnetic resonance (MR) data acquisition. The invention in particular concerns such methods and devices to process image data in which the MR system has multiple acquisition units for data acquisition, for example multiple acquisition coils or multiple segments of a coil array, wherein complex image data are acquired at multiple echo times with each of the acquisition units.

2. Description of the Prior Art

MR imaging has found wide application since it enables the acquisition of two-dimensional or three-dimensional image data that can depict structures inside an examination subject with high resolution. In MR imaging, the nuclear spins of hydrogen nuclei in an examination subject are aligned in a basic magnetic field ($B_0$) and subsequently excited by the radiation of RF (radio-frequency) pulses. The excited magnetization is detected as a function of time, with a spatial coding being achieved by various known methods. The acquisition of the signals frequently takes place with a quadrature detection so that both the phase and the amplitude of the signal are detected. The signals detected in positional frequency space (k-space) can accordingly be represented as complex numbers and be transformed into image space by means of a Fourier transformation in which phases and amplitudes can now be determined with spatial resolution.

In many imaging methods, only the amplitude of the complex image data is used to create an intensity image. The phase information is discarded.

Phase values can deliver valuable information that, for example, can be used in the determination of an adipose tissue or aqueous proportion. Some imaging methods use the phase information. Examples of such methods include phase contrast imaging and proton resonance frequency (PRF) shift thermometry. In PRF shift thermometry, a phase shift in acquired phase images is detected that is caused by a temperature dependency of the proton resonance frequency.

In addition to phase shifts with information content, such as a temperature-dependent phase shift of a proton spin resonance frequency, there are effects that can cause unwanted phase shifts and can lead to artifacts. Causes of such unwanted phase shifts can be, for example, a system-dependent inhomogeneity of the basic field $B_0$, the susceptibility of articles and materials within or in proximity to the examination subject, phase shifts of the radiated RF pulses, and errors in the chronological order of the acquisition sequence. Such phase shifts make it difficult to compare and/or to combine with one another image data acquired at different echo times. Different phase shifts can also occur in different acquisition channels, which can hinder a combination of image data that are associated with different echo times and different acquisition coils.

Various approaches have been described to combine complex image data that were acquired with multiple acquisition units. U.S. Pat. No. 6,483,308 B1 and U.S. Pat. No. 7,227,359 B1 are examples. In these approaches, for each acquisition coil the image data that are acquired with this acquisition coil at different echo times are combined. A merging of the combined images that were acquired for the different acquisition coils subsequently takes place in a second step. In this regard U.S. Pat. No. 7,227,359 B2 discloses a method that is based on phase gradients in the image data. However, such approaches can be prone to the occurrence of artifacts (singularities, for example) in the resulting images that hinder a consistent evaluation.

Additional examples for MR imaging methods that use phase information are known as Dixon methods. In these image data of the examination subject are acquired at different echo times. The pulse sequences are conventionally selected so that the spins of different spin species are parallel or anti-parallel at the echo times in order to enable a computational processing. However, this requirement can lead to the situation that high demands are placed on the RF system and its controller. An MR data acquisition can also take an undesirably long period of time in order to detect echo signals with the predetermined phase relationships between different spin species. A long duration of the MR data acquisition in turn increases the risk of movement artifacts.

SUMMARY OF THE INVENTION

An object of the invention is to provide a method and device to process complex image data that reduce some of the aforementioned disadvantages. In particular, a simple determination of at least one MR parameter—a $B0$ inhomogeneity, for example—should be enabled on the basis of multiple image data acquired with different acquisition coils for an examination subject with multiple spin species.

In a method according to the invention for processing complex image data of an examination subject, the complex data are image data representing image points that each include an item of phase information and the examination subject has at least one first spin species and a second spin species differing from the first sin species. In an MR data acquisition, complex image data are acquired with each of multiple acquisition units at a number of echo times, such that a phase difference between the first spin species and the second spin species is different at least two of the echo times. For multiple image points, a value of the at least one MR parameter is determined so that a function satisfies an extreme condition. The function depends on the at least one MR parameter and the corresponding image point in the complex image data that that are acquired with the multiple acquisition units at least two of the echo times.

In the method, the at least one MR parameter is determined based on the function that depends on the corresponding image point in multiple complex sets of image data, the different acquisition units and different echo times. In this way a simultaneous combination of complex image data that are associated with different echo times and different acquisition units takes place without a prior combination of image data acquired at different echo times with an acquisition unit being necessary. A consistent combination of the multiple image data can thereby be facilitated.

The extreme condition can be such that the value of the at least one MR parameter is determined for which the function exhibits at least one local extreme depending on the MR parameter.

The application to imaging of an examination subject that has multiple spin species with the specified selection of echo times allows the determination of parameters such as local inhomogeneities of the basic field or local aqueous or adipose proportions. Moreover, it is not absolutely necessary to control the data acquisition so that the precessing spins of the different spin species must always be parallel or anti-parallel at echo times. The flexibility in the data acquisition is increased in this way. The time required overall for data acquisition can be reduced.

The first spin species can be to hydrogen nuclei in water, and the second spin species can be to hydrogen nuclei in adipose tissue.

The different complex image data can be combined according to a Dixon method.

The at least one MR parameter that is determined can be a magnetic field inhomogeneity. The spatially resolved knowledge of this parameter can be used in a phase correction, for example. The at least one MR parameter can additionally include or alternatively be a variable that quantifies a proportion of the first and/or second spin species with spatial resolution. Adipose tissue can be differentiated from water using this parameter. For example, this information allows the identification of image regions in which a thermometry can be implemented with only low reliability. The at least one MR parameter can also be a $T_2^*$ time of the first spin species, $[T_2^*]_1$, and/or a $T_2^*$ time of the second spin species, $[T_2^*]_2$.

An equation system can be solved with an electronic computer to determine the at least one MR parameter. The equation system can represent extreme conditions (in particular maximum conditions) of a probability distribution. The probability distribution can depend on the at least one MR parameter. The equation or equations of the equation system can be such that the MR parameters on which the probability distribution depends are determined depending on the acquired complex image data that are viewed as the most probable measurement values in the sense of the maximum likelihood theory.

The equation system composed of multiple equations can represent maximum conditions of a Gaussian probability distribution for image points acquired in the MR data acquisition at the multiple echo times and with the multiple acquisition units.

The maximum conditions can be independent of sensitivities of the acquisition units. Using Bayesian statistics, an effective probability distribution can be determined in which the unknown sensitivities of the acquisition units are marginalized or integrated out, such that they no longer occur in the extreme conditions. Other variables that are not dependent on the echo time (amplification factors, for example) can similarly be eliminated from the probability distribution.

The equation system can represent the condition $$0 = \sum_{a=1}^{N} \sum_{b=1}^{N} (\tau_a - \tau_b) \mathrm{Exp}[i\omega_{\Delta B0}(\tau_a - \tau_b)] g_a g_b^* \vec{d}_a^{*\dagger} \vec{d}_b \quad (1)$$

wherein N represents a number of echo times and $\tau_n$ represents the n-th echo time, wherein a vector $\vec{d}_n$ associated with the n-th echo time $\tau_n$ has matrix elements that depend on image data acquired with the multiple acquisition units at said echo time $\tau_n$. $\omega_{\Delta B0}$ is a spatially resolved shift to be determined of a precession frequency. Furthermore, for the case of an examination subject that has two spin species, $$g_n = r_1 \mathrm{Exp}[(-1/[T_2^*]_1)\tau_n] + (1-r_1)\mathrm{Exp}[(-1/[T_2^*]_2 + i\omega_2)\tau_n] \quad (2)$$

can be the case, wherein $r_1$ is the local proportion of the first spin species, $[T_2^*]_1$ is the $T_2^*$ time of the first spin species, $[T_2^*]_2$ is the $T_2^*$ time of the second spin species, and $\omega_2$ is the difference between the precession frequency of the second spin species and a precession frequency of the first spin species.

The equation system can also represent the condition $$0 = \sum_{a=1}^{N} \sum_{b=1}^{N} \mathrm{Exp}[i\omega_{\Delta B0}(\tau_a - \tau_b)] \quad (3)$$

$$\left( \frac{\partial g_a}{\partial X_l} g_b^* + g_a \frac{\partial g_b^*}{\partial X_l} - \frac{\sum_{n=1}^{N}\left(\frac{\partial g_n}{\partial X_l}g_n^* + g_n \frac{\partial g_n^*}{\partial X_l}\right)}{\sum_{n=1}^{N} g_n g_n^*} g_a g_b^* \right) \vec{d}_a^{*\dagger} \vec{d}_b$$

for at least one variable $X_l$ that is selected from $r_1$, $[T_2^*]_1$, $[T_2^*]_2$ and $\omega_2$. The equation system can represent both the condition according to Equation (1) and the condition according to Equation (3) for each of the variables $X_l = r_1$, $X_l = [T_2^*]_1$, $X_l = [T_2^*]_2$ and $X_l = \omega_2$.

Equations (1)-(3) represent extreme conditions of a probability distribution for acquired complex image data. The probability distribution is an effective probability distribution in which the sensitivities of the acquisition units are integrated out.

An assessment of the at least one MR parameter can take place depending on the probability distribution. For example, the probability distribution for different complex image data can be evaluated depending on the MR parameters that were computationally determined. For example, it can thus be determined whether a wide scattering of acquired data values is to be expected. This can serve as a basis for the assessment of the reliability of the determined MR parameters. Alternatively or additionally, in the assessment for multiple possible values of the MR parameter for which the extreme conditions are satisfied it can be determined how great the probability is to acquire the acquired complex image data. In this way it can be determined which of the values for the at least one MR parameter corresponds to a physically probable measurement.

Depending on the probability distribution, a standard deviation of the at least one MR parameter can be determined and/or covariances of multiple MR parameters can be determined. These variables can serve as a basis for the assessment of the reliability of the determined MR parameters.

To determine the at least one MR parameter, an equation system comprising multiple equations that is independent of sensitivities of the acquisition units can respectively be solved for multiple image points with electronic computing means.

To determine the at least one MR parameter, a product of a complex conjugation of an image point in image data acquired with the acquisition unit at one echo time and a complex conjugation of the image point in additional image data acquired with the same acquisition unit at an additional echo time can respectively be determined for complex image data acquired with multiple acquisition units. The products determined for multiple acquisition units can be totaled up in order to determine the extreme condition. In this way image data that are associated with different acquisition units and different echo times can be combined simultaneously.

In the method, a first image point measurement value vector can be determined for an echo time whose elements are values of an image point in the complex image data acquired at the echo time with the different acquisition units. A second image point measurement value vector can be determined for an additional echo time, the elements of which second image point measurement value vector are values of this image point in the complex image data acquired with the various acquisition units at the additional echo time. The determination of the value of the at least one MR parameter can be a determination of a scalar product from the complexly conjugated first image point measurement value vector and the second image point measurement value vector.

The at least one MR parameter can be determined per image point. A spatially resolved determination is thereby possible. Furthermore, the computational complexity can be kept to a moderate level since no combination of data that are associated with different image points must take place.

The function for which the extreme condition is satisfied in order to determine the value of the at least one MR parameter for an image point can be independent of all other image points of the image data. The determination of the at least one MR parameter for an image point can thus take place independently of all other image points of the complex image data. The at least one MR parameter can thus be determined at an image point depending on the corresponding value for the image point in image data that were acquired by the different acquisition units and at the different echo times, but independently of all other image points in these image data.

The data acquisition can take place so that, for at least one of the echo times, the phase difference between the first spin species and the second spin species is different than k·180°, wherein k is a whole number or equal to zero. Such a flexible selection of echo times that differs from conventional Dixon methods leads to greater flexibility and can be used to accelerate the imaging. In conventional terminology for Dixon methods, the angle between spins of the first spin species and spins of the second spin species given their precession in a plane perpendicular to the B0 field is understood as a phase difference.

For at least one of the echo times, the phase difference between the first spin species and the second spin species can be approximately +90° or −90°.

The invention also encompasses a device for processing of complex image data of an examination subject that has a first spin species and a second spin species differing from this. The complex image data are such that, given an MR data acquisition with multiple acquisition units at a plurality of echo times, it was detected that a phase difference between the first spin species and the second spin species is different at least two of the echo times. The device is configured to determine with spatial resolution at least one MR parameter that influences signals acquired in an MR data acquisition. The device has an interface to receive the complex image data and an electronic computer configured to computationally determine, for multiple image points, a value of the at least one MR parameter so that a function satisfies an extreme condition. The function depends on the at least one MR parameter and the corresponding image point in the complex image data that were acquired with the multiple acquisition units at least two of the echo times.

The device is configured to implement any or all of the embodiments of the method described above.

The invention also encompasses a magnetic resonance system for MR imaging that has multiple acquisition units—in particular multiple acquisition coils or segments of a coil array, that respectively acquire complex image data, and a device according to any of the exemplary embodiments described above that is coupled with the multiple acquisition units.

The magnetic resonance system is configured to acquire complex image data of an examination subject that has a first spin species and a second spin species differing from the first spin species with the multiple acquisition units such that a phase difference between precessing spins of the first spin species and the second spin species is different at least two of the echo times. For this purpose, the magnetic resonance system can have a coil arrangement and a control device coupled with the coil arrangement.

The above object also is achieved in accordance with the present invention by a non-transitory computer-readable data storage medium encoded with programming instructions that when the medium is loaded into a control and processing system of an magnetic resonance imaging apparatus, cause any or all embodiments of the method described above to be implemented.

Various methods to acquire the complex image data can be used in the methods and devices according to the various exemplary embodiments. In particular, the complex image data can be acquired and reconstructed with a partially parallel acquisition method. The image data acquired at different echo times can be acquired with a multi-echo imaging method, in particular an MGRE imaging method.

BRIEF DESCRIPTION OF THE DRAWINGS

FIG. 6 schematically illustrates an evaluation of a determined MR parameter in a method according to an exemplary embodiment.

DESCRIPTION OF THE PREFERRED EMBODIMENTS

Exemplary embodiments allow an MR parameter or multiple MR parameters to be determined directly from a number of image data that are acquired with multiple acquisition units and at a plurality of echo times. For example, a resonance frequency shift $\omega_{\Delta B0}$ (thus a change of the precession frequency of the protons, for example due to the chemical shift or an inhomogeneity of the B0 field), an adipose tissue or aqueous proportion or a $T_2^*$ time can be determined in this manner. According to exemplary embodiments, the at least one MR parameter is determined directly from the image data acquired with different acquisition units at different echo times.

While reference is made in part to specific MR imaging sequences for explanation in the following Specification to, other sequences than those cited can also be used. MR data are thereby acquired at different echo times. For example, multi-echo imaging sequences or other spin or gradient echo sequences can be used with which image data can be acquired at different echo times.

Figure 1:
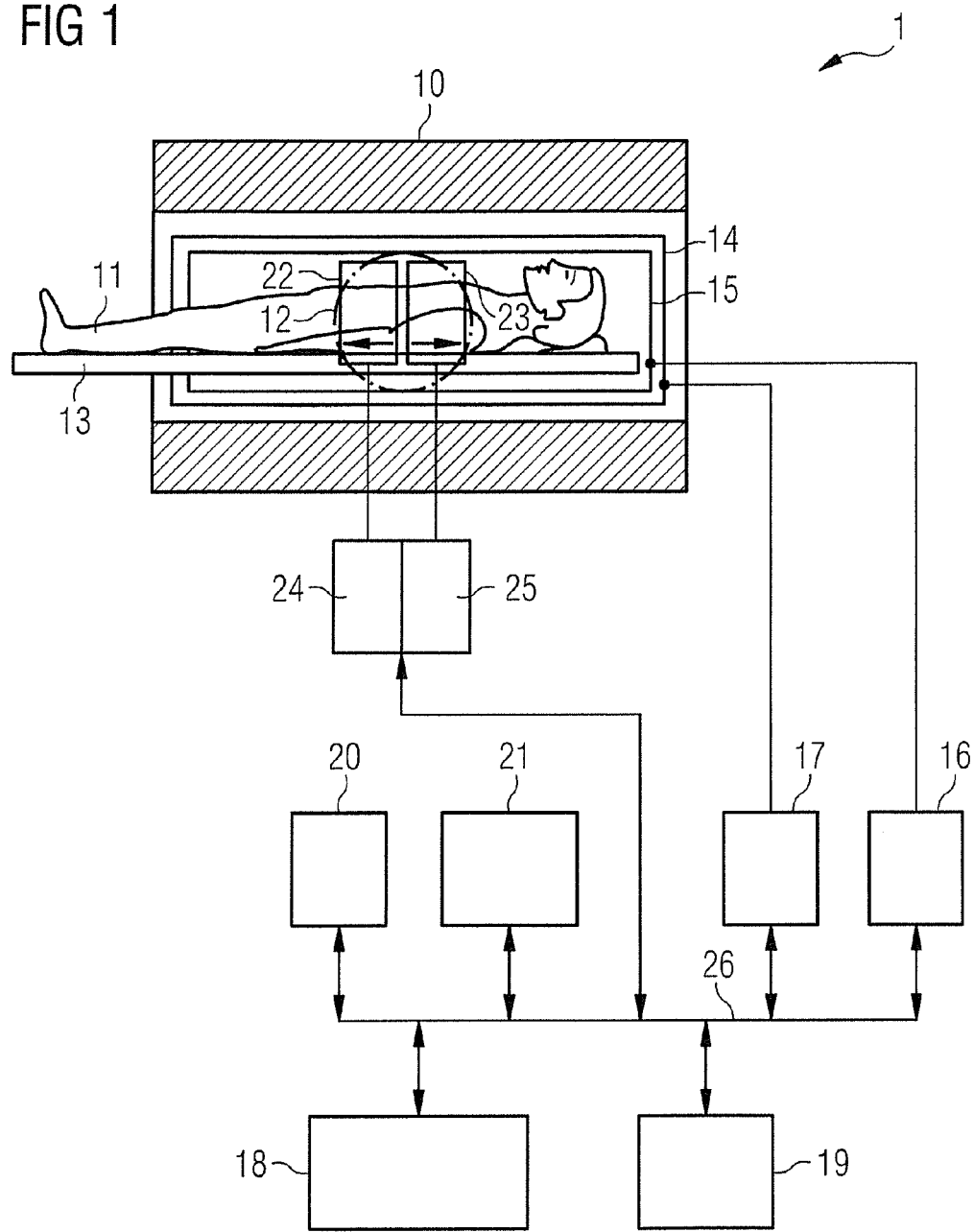
FIG. 1 is a schematic representation of a magnetic resonance system according to an exemplary embodiment of the invention.

FIG. 1 schematically shows a magnetic resonance (MR) system 1. The MR system 1 has a magnet 10 to generate a polarization field B0. An examination subject 11 can be shifted on a bed table 13 relative to the magnet 10. The MR system 1 has a gradient system 14 to generate magnetic field gradients that are used for the imaging and spatial coding. To excite the magnetic polarization that is generated in the B0 field, a radio-frequency (RF) coil arrangement 15 is provided that generates a radio-frequency field. A gradient unit 17 is provided to control the gradient system 14, and an RF unit 16 is provided to control the RF coil arrangement 15.

The acquisition of MR signals from an examination region 12 can take place by means of a coil arrangement. The MR system 1 has multiple receiver coils 22, 23 to receive MR signals. The receiver coils can respectively be local receiver coils or component coils. These can be part of a larger coil array (phased array coils, for example) that can comprise additional receiver coils. The receiver coils 22, 23 are respectively set up so that phase information can also be derived from the received signals. Each receiver coil 22, 23 can thus comprise a coil pair in a quadrature arrangement. Separate receiver circuits 24 or, respectively, 25 can be provided for the receiver coils so that a raw data set with MR data can be acquired in parallel for each receiver coil. Correlations in the coil noise can thereby be suppressed.

The MR system 1 is centrally controlled by a control unit 18. The control unit 18 controls the radiation of RF pulses and the acquisition of resulting MR signals. A reconstruction of image data from the raw MR data and a continuative processing of the image data takes place in a computer 19. The raw data can be provided to the computer 19 via a suitable interface 26, for example a bus. Via an input unit 20, an operator can select various protocols and input and modify parameters for the data acquisition, which are indicated on a display 21.

The control unit 18 is set up in order to control the MR system 1 to implement an echo imaging sequence, for example a turbo spin echo or MGRE sequence. The echo sequence can be part of an EPI sequence in which all k-space lines are scanned within a repetition period, i.e. in which a complete image data set is acquired after an excitation. In an EPI (echoplanar imaging) sequence, before each echo the phase coding is changed so that the entirety of k-space can be scanned with one echo train. Segmented EPI sequences can also be used with which a portion of k-space is scanned with an echo train. An EPI sequence can be gradient echo-based or spin echo-based. An equivalent echo time can be associated with the resulting image data. In particular, the control can take place such that a multi-echo sequence (MGRE, for example) is implemented with which a sequence of gradient echoes is generated via repeated switching of gradients. One k-space line can respectively be scanned with an echo train, wherein each echo corresponds to a different echo time. An image data set can subsequently be reconstructed for each echo time and each receiver coil 22, 23 from the echo trains for the k-space lines to be scanned.

The control unit 18 is designed so that an MR imaging can be implemented on an examination subject that has multiple spin species such that a phase difference between spins of a first spin species and spins of a second spin species—i.e. the relative angles of the spins given precession in a plane perpendicular to the B0 value—has varying values at different echo times. The control unit 18 and the RF unit 16 and the gradient system 14 can be designed so that an MR imaging sequence is implemented so that spins of a first spin species and spins of a second spin species exhibit different phase differences at different echo times.

The control unit 18 can control the MR data acquisition so that, at least one of the echo times, the spins of the first spin species and the spins of the second spin species have a phase difference different than 0° and different than whole-number multiples of 180°. For example, the control unit 18 can be designed so that, at least one of the echo times, the phase difference between the spins of the first spin species and the spins of the second spin species amounts to 90° or −90°. This can be achieved via a corresponding workflow control of a pulse sequence, depending on a difference of the precession frequencies of the spins of the first spin species and the spins of the second spin species that is approximately known anyway.

The first spin species can be the nuclear spin of hydrogen nuclei in water, and the second spin species can be the nuclear spin of hydrogen nuclei in adipose tissue.

The MR system 1 can be set up to implement an accelerated imaging, for example a partially parallel imaging method (ppa) such as SENSE, GRAPPA or SMASH. Control unit 18 can be configured so that, by omitting k-space lines, only an incomplete scan of k-space is to be produced, wherein the acquisition of MR signals takes place simultaneously with the receiver coils 22 and 23 as well as possible additional coils, however. A reconstruction of the missing data can then take place in k-space or in image space, depending on the method. The control unit 18 can be configured to implement the k-TE GRAPPA method described in "k-TE Generalized Autocalibrating Partially Parallel Acquisition (GRAPPA) for Accelerated Multiple Gradient-Recalled Echo (MGRE)$R_2^*$ Mapping in the Abdomen", by Xiaoming Yin et al., Magnetic Resonance in Medicine 61:507-516 (2009). k-TE GRAPPA uses an MGRE acquisition sequence in which peripheral regions of k-space are only scanned incompletely. Omitted k-space lines are reconstructed not only using adjacent k-space lines that were acquired with adjacent receiver coils of a coil array, but also using k-space lines for adjacent echo times. The results are complete image data sets for the various echo times and for each of the receiver coils that is used.

The image reconstruction of the image data can be implemented by computer 19 by means of conventional reconstruction methods suitable for the respective acquisition sequence. In the image reconstruction, corresponding complex image data that include both amplitude information and phase information are generated from the complex raw MR data acquired with the receiver coils 22, 23.

The computer 19 is configured to process the complex image data that were respectively acquired with the multiple receiver coils at a plurality of echo times. Data per image point can be combined from the various image data sets in order to determine one or more MR parameters. The number of determined MR parameters can vary depending on the number of echo times at which a data acquisition is implemented with each of the acquisition coils. The number of echo times is designated with N in the following, and the number of receiver coils with which complex image data can respectively be acquired is designated with M in the following. In one embodiment, the control unit 18 can be designed so that echo signals are acquired at two different echo times with each of the receiver coils. A local shift $\omega_{A\!B0}$ of the resonance frequency of at least one spin species and a local proportion of the first and/or second spin species can be determined depending on the 2·M sets of image data in total. In a system with two spin species, the local proportion can be quantified by a variable $r_1$ that indicates the relative proportion of the spins of the first spin species.

In a further embodiment, the control unit 18 can be designed so that echo signals at three or four different echo times are detected with each of the receiver coils. A local shift $\omega_{A\!B0}$ of the resonance frequency of at least one spin species, the variable $r_1$, a $T_2^*$ time of the first spin species ($[T_2^*]_1$), and a $T_2^*$ time of the second spin species ($[T_2^*]_2$) can be determined depending on the 3·M or 4·M sets of image data in total.

The computer 19 can be configured to determine the MR parameter or parameters per image point. The determination of the MR parameter or parameters at a point can thereby take place depending on this image point in the N·M sets of image data and independent of the other image point in the N·M sets of image data. In this way the numerical cost in the spatially resolved determination of the at least one MR parameter can be kept to a moderate level.

To determine the at least one MR parameter, the computer 19 can be set up in order to solve an equation system with multiple equations. If at least two MR parameters—for example the shift $\omega_{\Delta B0}$ of the resonance frequency and the proportion $r_1$ of a spin species—should be determined with spatial resolution, an equation system with at least two equations can be solved by the computer 19. If four MR parameters should be determined with spatial resolution, an equation system with at least four equations can be solved by the computer 19. The equations of the equation system can represent extreme conditions of a function that depends on the MR parameters and the value for the corresponding image point in the N·M sets of image data. This function can be an exponent of a probability distribution, for example a Gaussian probability distribution. The probability distribution can be a probability distribution for values for the image point in the image data that are acquired in an MR data acquisition with the M receiver coils at the N echo times. The probability distribution depends on the at least one MR parameter. The probability distribution can be an effective probability distribution in which sensitivities of the receiver coils have been integrated out.

By using the acquired values for the image point in the function, those values for the at least one MR parameter for which the function exhibits a local extreme can be determined via calculation. In this way the MR parameters on which the probability distribution depends can be determined under the physically motivated assumption that the acquired image data are close to the most probable image data in the sense of the maximum likelihood theory.

The mode of operation of the computer 19 in MR systems according to exemplary embodiments is described in detail with reference to FIG. 2-6.

Figure 2:
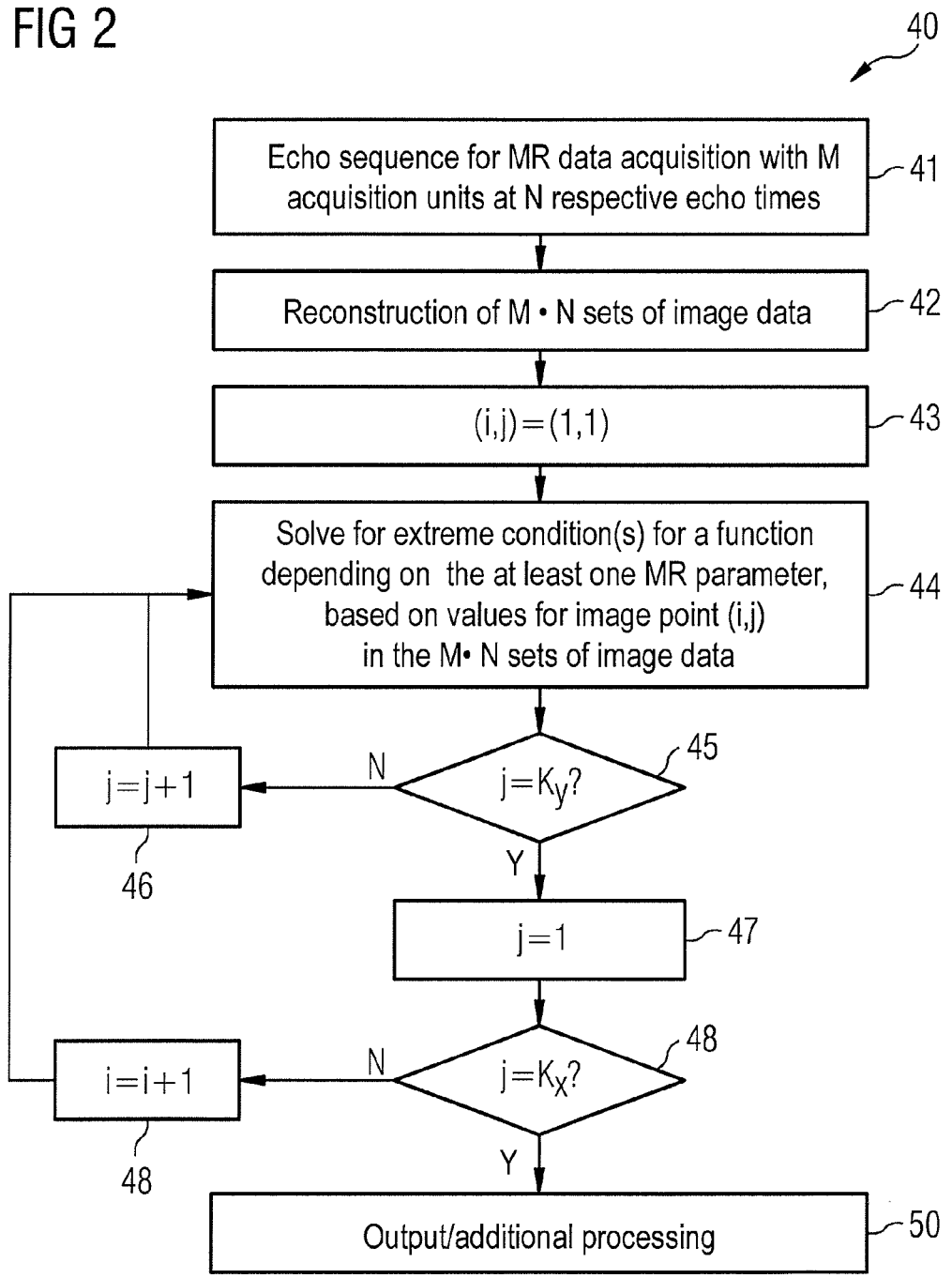
FIG. 2 is a flowchart of an exemplary embodiment of the method according to the invention.

FIG. 2 is a flowchart representation of a method 40 according to one exemplary embodiment. The method can be implemented with the MR system 1.

MR data are respectively acquired at 41 with multiple acquisition units at multiple echo times. The acquired MR data are such that complex image data that include phase information can be reconstructed from the acquired MR data. For MR data acquisition, the control unit 18 can induce the implementation of an acquisition sequence, for example a gradient echo sequence or spin echo sequence. The MR data acquisition takes place so that image data for different acquisition units and echo times can be obtained from the acquired MR data, possibly after corresponding supplementation via reconstruction. The number of different echo times at which MR image data are acquired for additional precessing is designated with N. The number of acquisition units with which complex image data are respectively acquired is designated with M.

The MR data acquisition 41 takes place so that a phase difference between the spins of the first spin species precessing around the B0 field and the spins of the second spin species precessing around the B0 field is different at least two of the echo times. This can be achieved by a suitable selection of the temporal workflow of the acquisition sequence. For this is an estimation between the difference between precession frequencies of the spins of the first spin species and the spins of the second spin species can be used.

Complex image data are reconstructed at 42 for each echo time and for each acquisition unit. M·N sets of image data can thus be reconstructed. A set of image data can be a two-dimensional or three-dimensional mapping, wherein the image data sets have image points in the form of pixels or voxels. In partially parallel acquisition methods, the reconstruction can initially takes place via expansion of the raw data in k-space and subsequent Fourier transformation, or by antialiasing the image data sets for different coils in image space. The term "complex image data" here is used as meaning that the complex image data include both amplitude information and phase information. For example, a complex value can be assigned to each image point of the image data set.

The value of at least one MR parameter is subsequently respectively determined for multiple image points in 43-50. The at least one MR parameter can be selected from a group that comprises a local inhomogeneity of the B0 field or a shift of a resonance frequency caused by other sources; a variable that quantifies with spatial resolution a proportion of the first and/or second spin species; a $T_2^*$ time of the first spin species ($[T_2^*]_1$); and a $T_2^*$ time of the second spin species ($[T_2^*]_2$).

The determination of the MR parameter can take place per image point such that the MR parameter for an image point is determined depending on the corresponding image point in the complex image data but independent of the other image points in the complex image data. The determination of the MR parameter can be implemented automatically by the computer 19.

To determine the at least one MR parameter per image point, at 43 a coordinate duplet (i, j) of image point coordinates is initialized. The complex image data respectively have Kx image points in a first direction (an x-direction for example) and Ky image points in a second direction (a y-direction, for example).

At 44, the at least one MR parameter is determined so that one extreme condition is, or typically multiple extreme conditions, are satisfied for a function. The function depends on the at least one MR parameter and the image point (i, j) in the sets of image data that were acquired with the M different acquisition units and at the N different echo times. The function can be a probability distribution for the values that are acquired in an MR data acquisition for the image point (i, j) in the image data acquired with the different image data acquisition units and at the different echo times. The function can also be an exponent of such a Gaussian probability distribution. The function can also be a function derived from the exponent of such a Gaussian probability distribution.

Implementations for the determination of the MR parameter at 44 are described in further detail according to exemplary embodiments.

In Steps 45-49, the determination of the at least one MR parameter can be implemented for additional image points by incrementing the image point coordinates (i, j). For this, in 45 it can be checked whether the image point (i, j) is the last image point of an image line (i.e. whether j=Ky). In the event that an additional image point exists in the image line, in 46 the index j can be incremented. The method returns to 44, where the at least one MR parameter is determined for the next image point. In the event that it is determined at 45 that the image point (i, j) is the last image point of an image line (i.e. that j=Ky), at 47 the index j is reset to 1. In 48 it can be checked whether the image point (i, j) is the image point of an image column, i.e. whether i=Kx). In the event that it is determined at 48 that the image point (i, j) is not the point with the coordinates (Kx, Ky), in 49 the index can be incremented. The method returns to 44, where the at least one MR parameter is determined for the next image point. In the event that it is determined at 48 that the image point (i, j) is the last image point—i.e. the image point with the coordinates (Ky, Kx)—the method continues at 50.

At 50 the at least one MR parameter determined with spatial resolution can be output and/or provided for an additional processing. The additional processing or output can occur in different ways in different applications.

For example, in 50 a map of the at least one MR parameter can be generated and output at the display device 21 of the MR system 1. For example, a map that shows the proportion of water and aqueous tissue with spatial resolution can be generated and presented. Alternatively or additionally, a map of $T_2^*$ times of the first and/or second spin species can also be generated and shown.

The method can also include an additional use of the MR parameter determined with spatial resolution. For example, the information (determined with spatial resolution) about the shift of the precession frequency of the spins of the first spin species ($\omega_{A,B0}$) can be used for the implementation of a phase correction.

The information about the local proportion of spins in water and in adipose tissue can be combined with data that are obtained in an MR data acquisition for PRF shift thermometry in order to assess the reliability of the obtained temperature profiles.

In the event that the function for which extreme conditions are solved in 44 is a probability distribution or is connected with such a probability distribution (as this is the case for the exponents of a Gaussian distribution, for example), the at least one MR parameter determined at 44 can be used in the probability distribution. The at least one MR parameter that was determined at 44 should be a probable parameter value in the sense of the maximum likelihood theory, such that the probability distribution for acquired image data typically reflects the physical conditions of the MR system and the examination subject well. Using the probability distributions, a scattering can be determined for image data that are obtained in the data acquisition with multiple acquisition units and at multiple echo times. It can also be tested whether the image data already acquired are a probable measurement result or a less probable measurement result.

In the event that the function for which extreme conditions are solved at 44 is a probability distribution or is connected with such a probability distribution (as this applies to the exponents of a Gaussian distribution, for example), the at least one MR parameter determined at 44 can also be used in the probability distribution in order to determine variances of the at least one MR parameter or covariances between different MR parameters. In general, from a probability distribution for the data expected at an arbitrary image point in an MR data acquisition with M acquisition units and at N echo times that can be combined with M·N entries in an image point measurement value vector $\vec{d}$, a covariance matrix for parameters X and Y of the probability distribution can be calculated according to $$[\Psi^{-1}]_{X,Y} = \left.\frac{\partial^2 \log P(\vec{d} \mid \vec{A}_0, \ldots)}{\partial X \partial Y}\right|_{MaxP} \quad (4)$$

$\Psi^{-1}$ is the inverse covariance matrix for parameters at an image point, $P(.|.)$ is a conditional probability distribution for the image point measurement value vector $\vec{d}$ at the image point that is conditionally dependent on non-echo time (TE)-dependent variables. The non-echo time-dependent variables are combined in a vector $\vec{A}$. The right side of Equation (4) is evaluated at the maximum of the probability distribution.

Based on the covariances determined in such a manner, the dependency of an MR parameter on other MR parameters can be determined. For example, the dependency of a relative water content $r_1$ on an assumed shift of a resonance frequency for nuclear spins in adipose tissue can be determined.

Figure 3:
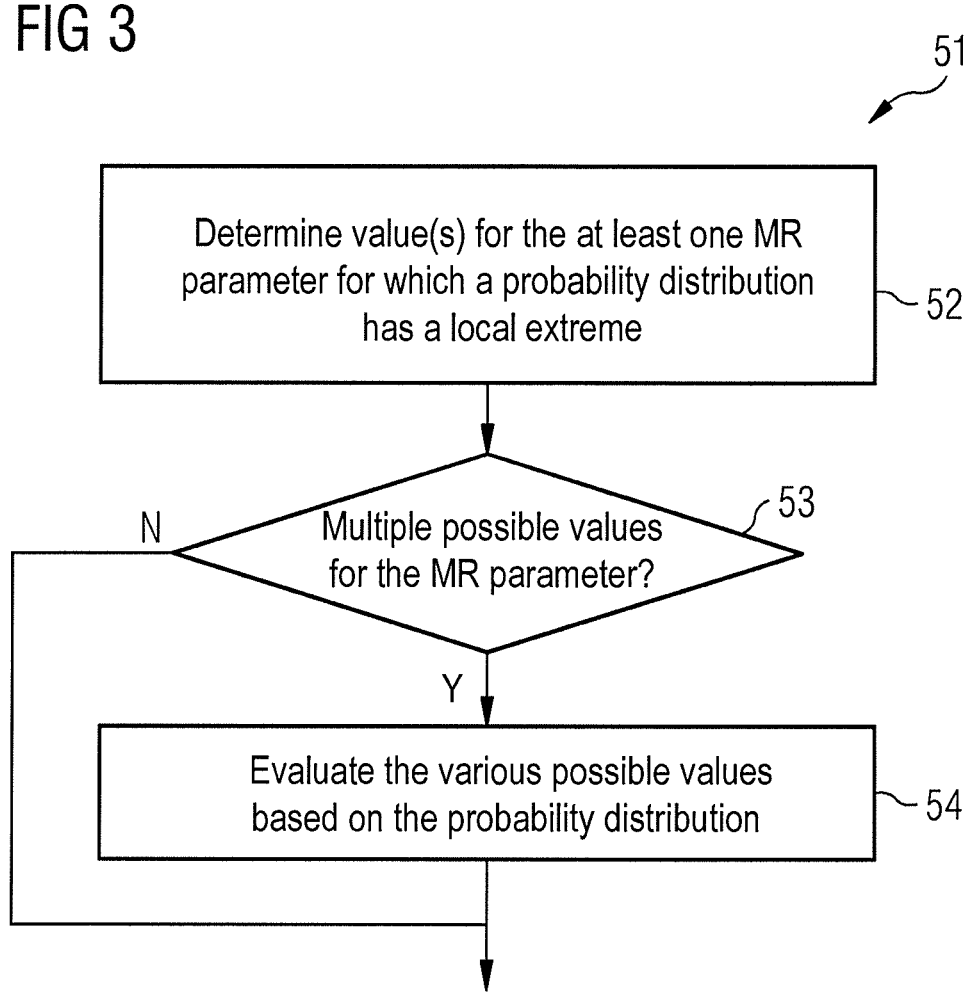
FIG. 3 is a flowchart of a procedure to determine at least one MR parameter that can be used in the method of FIG. 2.

FIG. 3 is a flowchart of a procedure 51 to describe in detail the determination of the value of an MR parameter or the values of multiple MR parameters at an image point. The procedure can be used to implement Step 44. In the procedure 51, the function whose extreme condition is used to determine the MR parameter or MR parameters is a probability distribution for data acquired in the MR data acquisition with multiple acquisition units and at multiple echo times. The function can also be derived from such a probability distribution. For example, the function can be an exponent of a Gaussian probability distribution.

In 52 the value for one or more MR parameters is determined so that the probability distribution has a local extreme, in particular a local maximum. For this an equation system comprising multiple equations can be solved automatically with the electronic computer 19. The multiple equations depend on the at least one MR parameter. Moreover, the multiple equations depend on the value for the corresponding image point in the image data that were acquired with multiple acquisition units and at multiple echo times. However, the equations can be independent of all other image points in the N·M sets of reconstructed image data.

In the solution of the equations for the MR parameters that define the extreme conditions, the values acquired in the MR data acquisition are used for the image data that were acquired by the multiple acquisition units and at multiple echo times. The probability distribution thus can be considered a function of its parameters, i.e. of the MR parameters to be determined. The probability distribution is advantageously such that non-echo-dependent variables were marginalized or integrated out. In this way it can be achieved that the equations to be solved are independent of coil sensitivities of the receiver coils 22, 23.

The equations do not necessarily need to deliver an unambiguous solution for which the probability distribution has one local maximum. In 53 it can be checked whether multiple values for which the extreme conditions are satisfied exist for the at least one MR parameter.

In the event that multiple possible values exist for which the extreme conditions are satisfied, at 54 the multiple possible values are assessed depending on the probability distribution. For this purpose, the respective determined values for the MR parameters can be used in the probability distribution, and the corresponding probabilities can thus be calculated. That set can be selected that corresponds to an absolute maximum of the probability distribution from the possible different sets of values for the MR parameters. This set of values for the MR parameters is then used further.

In the event that it is determined at 53 that only one set of values exists for which the MR parameters maximize the probability distribution, this is used further.

Figure 5:
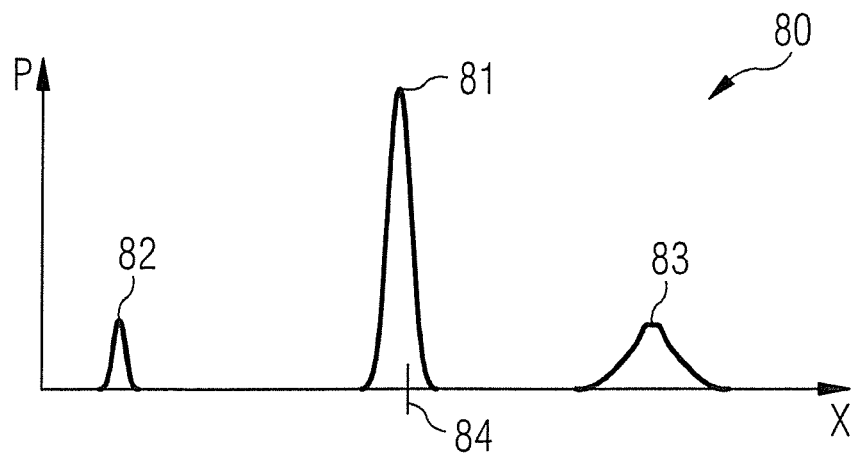
FIG. 5 schematically illustrates the formation of image point measurement value vectors for image points.

FIG. 5 is a schematic representation 80 to illustrate the evaluation of possible values for MR parameters. A probability distribution P as a function of an MR parameter X is shown. For example, the MR parameters X can be a proportion $r_1$ of spins that corresponds to water or adipose tissue. The probability distribution is shown as a function of the MR parameter X.

The probability distribution as a function of the MR parameter X has multiple local maxima 81-83. By calculating the partial derivative according to the MR parameter X and possible additional MR parameters, the values of the MR parameter X can be determined at which the local maxima exist. In order to determine which values for the MR system and the examination subject represent probable values of the MR parameters, the associated probability P is calculated. Sets of values for the MR parameters that correspond to low probabilities can be discarded. For the example probability distribution of FIG. 5, the maximum 81 is identified as an absolute maximum. The value shown at 84 is accordingly used as a value for the MR parameter X that satisfies the extreme condition.

In the MR system and in methods according to exemplary embodiments, image data that were respectively acquired with multiple acquisition devices at multiple echo times can be simultaneously combined in order to determine the at least one MR parameter with spatial resolution. This is schematically depicted in FIG. 4.

Figure 4:
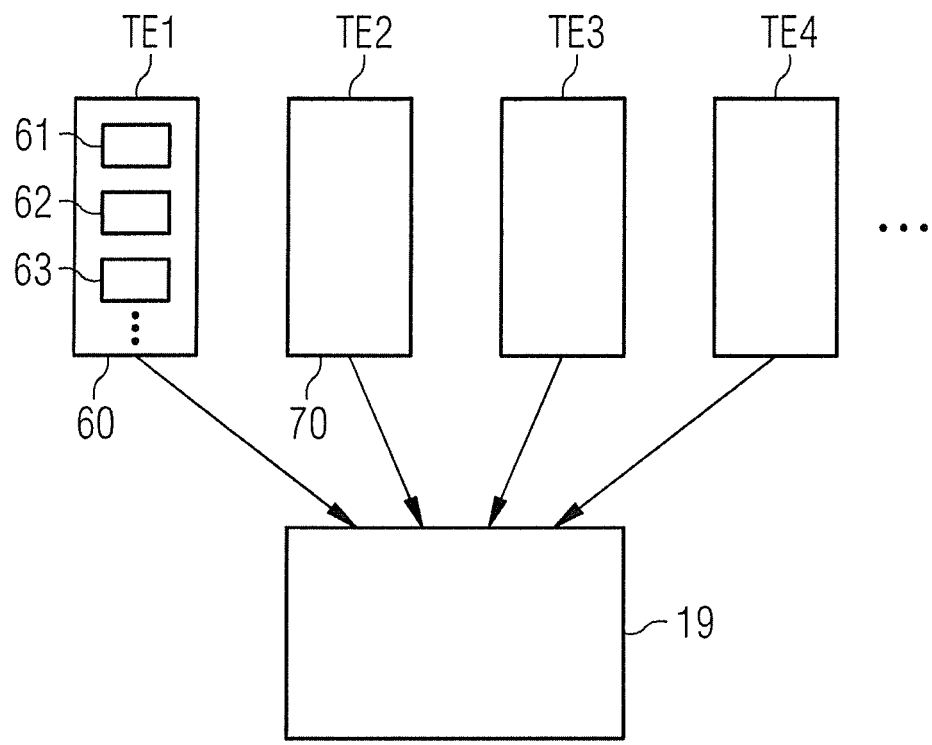
FIG. 4 schematically illustrates the determination of the at least one MR parameter from image data.

FIG. 4 is a schematic representation to explain the use of image data for spatially resolved determination of MR parameters such as local aqueous tissue or adipose tissue proportions, $T_2^*$ times and/or shifts of the resonance frequency.

A set of image data is respectively acquired with multiple acquisition units at a plurality of echo times TE1, TE2, TE3, TE4. The set of image data acquired by a first acquisition unit at a first echo time TE1 is schematically shown at 61. The set of image data acquired by a second acquisition unit at the first echo time TE1 is schematically shown at 62. The set of image data acquired by a third acquisition unit at the first echo time TE1 is schematically shown at 63. The entirety of these M sets of image data is schematically shown at 60. M sets of image data that are represented by the block 70 are similarly acquired by the different acquisition units M at the echo time TE2.

The computer 19 of an MR system processes these M·N sets of image data together, as was described with reference to FIG. 1-FIG. 3. For this the values for an image point in the M·N sets of image data or in a portion of these sets of image data can be used in extreme conditions for a function. Values for the MR parameters can thus be identified that at least approximately maximize a probability distribution for the acquired image data. A previous combination of image data that were acquired by one and the same acquisition unit at multiple echo times is not necessary. This facilitates the discovery of a consistent combination of the sets of image data that were acquired with different acquisition units and at different echo times.

The determination of the MR parameters in 44 in the method 40 of FIG. 2 or in 52 in the procedure 51 of FIG. 3 is described in further detail in the following. In the following it is assumed that a noise covariance matrix for noise acquired with different acquisition units and at the different echo times is essentially identical to a unit matrix. However, this assumption does not limit the generality of the following explanations since, via a combination of a linear transformation and a scaling of acquired data, it can be ensured that this assumption is satisfied. In order to determine such a linear transformation and scaling, for example, a noise covariance matrix can be determined for noise signals acquired with the different acquisition units and at the multiple echo times. This noise covariance matrix can then be diagonalized in order to find the linear transformation that eliminates correlations between different acquisition channels. The scaling can take place depending on the eigenvalues of the noise covariance matrix for the measured signal noise.

Extreme Conditions

In the MR systems and methods according to various exemplary embodiments, the function whose extreme conditions are evaluated in order to determine the at least one MR parameter with spatial resolution can be provided for an image point by $$\left(\sum_{n=1}^{N} g_n g_n^*\right)^{-1} \sum_{a=1}^{N} \sum_{b=1}^{N} \text{Exp}[i\omega_{\Delta B0}(\tau_a - \tau_b)] g_a g_b^* \vec{d}_a^{\dagger} \vec{d}_b. \quad (5)$$

a, b and n thereby designate indices for echo times. N is the total number of echo times for which image data are acquired. $\tau_n$ designates the n-th echo time for all $1 \leq n \leq N$. $\omega_{\Delta B0}$ designates a deviation of a precession or, respectively, resonance frequency of the spins of the first spin species from an expected value. Such a deviation can be caused by B0 inhomogeneities or susceptibilities of the examination subject, for example. The asterisk (*) typically designates complex conjugation of the corresponding variable, and the superscript dagger designates the hermetic adjoint of the corresponding variable. The variable $g_n$ is provided for all $1 \leq n \leq N$ by $$g_n = \left(\sum_{l=1}^{L} r_l\right)^{-1} \sum_{l=1}^{r_l} r_l \exp[(-1/[T_2^*] + i\omega_l) \cdot \tau_n]. \quad (6)$$

The variable $g_n$ is thus associated with the echo time $\tau_n$. The sum over the index 1 in Equation (6) is a sum over different spin species. For the case of water and adipose tissue, L=2. The variable $r_l$ designates the local proportion of the l-th spin species at the corresponding image point. If $r_l$ is normalized in a conventional manner so that $$\sum_{l=1}^{L} r_l = 1, \quad (7)$$

and the precession frequency $\omega_1$ is set equal to 0 (thus the precession frequency of the second spin species $\omega_2$ is measured in relation to the precession frequency of the first spin species, Equation (6) is simplified to Equation (2) for the case of two spin species L=2.

For all $1 \leq n \leq N$, the vector $\vec{d}_n$ in Equation (5) represents a vector associated with the image point, the entries of which vector is [sic] the value of the image point in the image data acquired at the echo time $\tau_n$ with different acquisition channels. The vector $\vec{d}_n$ can, for example, be represented as $$\vec{d}_n = \begin{pmatrix} d_{1,n} \\ d_{2,n} \\ \vdots \\ d_{M,n} \end{pmatrix}, \quad (8)$$

wherein $d_{1,n}$ represents the value of the image point in the image data acquired with the first acquisition unit at the n-th echo time $\tau_n$, $d_{2,n}$ represents the value of the image point in the image data acquired with the second acquisition unit at the n-th echo time $\tau_n$, and $d_{M,n}$ represents the value of the image point in the image data acquired with the M-th acquisition unit at the n-th echo time $\tau_n$. As mentioned above, it is assumed that the noise covariance matrix for the different acquisition channels is proportional to the unit matrix which—under the circumstances—requires a linear transformation and scaling of the data delivered by different acquisition coils. In this case, $d_{1,n}$ is understood as corresponding to the value of the corresponding image point (i.e. the image datum) in the image data that were transformed so that the noise covariance matrix for the different acquisition channels is proportional to a unit matrix.

FIG. 6 illustrates the calculation of the vector $\vec{d}_n$ for an image point and for two of the echo times. M sets of image data acquired at a first echo time TE1 are designated altogether with 60. At the first echo time, a first set of image data 61 is acquired with a first acquisition channel, a second set of image data 62 is acquired with a second acquisition channel, and a third set of image data 63 is acquired with a third acquisition channel. For an image point—for example the image point with coordinates (1, 1)—an associated image point measurement value vector $\vec{d}_1$ is calculated whose vector elements correspond to the image point 64 in the image data 61, the image point 65 in the image data 62, the image point 66 in the image data 63 etc. The image point measurement value vector $\vec{d}_n$ thus has matrix elements that represent the same voxel of the examination subject but were acquired with different acquisition units or, respectively, acquisition channels at the echo time $\tau_n$.

M sets of image data acquired at a second echo time TE2 are designated as a whole with 70. At the echo time, a first set of image data 71 is acquired with a first acquisition channel, a second set of image data 72 is acquired with a second acquisition channel, and a third set of image data 73 is acquired with a third acquisition channel. For an image point—for example the image point with coordinates (1, 1)—an associated image point measurement value vector $\vec{d}_2$ is formed whose vector elements correspond to the image point 74 in the image data 71, the image point 75 in the image data 72, the image point 76 in the image data 73 etc. The image point measurement vectors that are associated with the different echo times are then combined computationally in order to determine the at least one MR parameter at the image point.

The function indicated in Equation (5) is dependent across the vectors $\vec{d}_n$ on the image data that were respectively acquired with the multiple acquisition units at multiple echo times. Moreover, the function indicated in Equation (5) is dependent on the MR parameters $\omega_{\Delta B0}$ and $\omega_l$, $r_1$ and $[T_2^*]_l$ for $1 \le l \le L$. For two spin species, the function indicated in Equation (5) is dependent on $\omega_{\Delta B0}$, $\omega_2$, $r_1$, $[T_2^*]_1$ and $[T_2^*]_2$ when it is considered that $r_2 = 1 - r_1$ and $\omega_2$ is defined in relation to $\omega_1$ (thus $\omega_1$ can be set equal to 0).

As is described in detail, the function indicated in Equation (5) is selected such that its extreme corresponds approximately to the extreme for an effective Gaussian probability distribution for the acquired image data in which the sensitivities of the acquisition coils are integrated out. Under the realistic assumption that the acquired image data approximately correspond to the maximum of the probability distribution in any case, the condition follows that the partial derivatives of the function indicated in Equation (5) must be equal to 0 according to the MR parameters when the derivative is then respectively evaluated for the acquired image point measurement value vector $\vec{d}_n$.

The condition that the derivative of Equation (5) according to $\omega_{\Delta B0}$ is equal to 0 leads to Equation (1).

The condition that the derivative of Equation (5) according to $\omega_2$, $r_1$, $[T_2^*]_1$ and $[T_2^*]_2$ is equal to 0 leads to Equation (3).

The resulting equation system can be solved by an electronic computer of the MR system. Numerical methods can be used for this.

Equation (5) is independent of the sensitivities of the acquisition units. The MR parameters can thus be determined with spatial resolution without a precise knowledge of the sensitivities of the acquisition units being required.

For specific acquisition sequences, Equations (1) and (3) that represent extreme conditions for the function of Equation (5) can be simplified. For some of the MR parameters, closed solutions can be derived. Such cases are discussed in the following. In the following, the case with two spin species is considered, wherein $r_2 = 1 - r_1$ and $\omega_2$ is thereby defined relative to $\omega_1$; $\omega_1$ can thus be set equal to 0. However, the determination of the MR parameters such that Equation (5) satisfies extreme conditions can also be implemented given more than two species.

Two Echo Signals with Different Phase Differences Between the Spin Species

For a data acquisition in which two echo signals are acquired so that the phase differences between the spin species is different, the extreme conditions for Equation (5) can be represented in general as $$\mathrm{Exp}[2i\omega_{\Delta B0}(\tau_2 - \tau_1)] = \frac{g_1 g_2^* \vec{d}_1^\dagger \vec{d}_2}{g_2 g_1^* \vec{d}_2^\dagger \vec{d}_1} \quad (9)$$

and $$0 = \sum_{n=1}^{2} \sum_{a=1}^{2} \sum_{b=1}^{2} \mathrm{Exp}[i\omega_{\Delta B0}(\tau_a - \tau_b)] \quad (10)$$

$$\vec{d}_a^\dagger \vec{d}_b (\alpha_a g_n g_b^* g_n^* + \alpha_b^* g_n g_a g_n^* - \alpha_n g_a g_n^* g_b^* - \alpha_n^* g_n g_a g_b^*).$$

In Equation (10) it is thereby the case that $$\alpha_n = \frac{\partial g_n}{\partial r_1} \quad (11)$$

and $$\alpha_n^* = \frac{\partial g_n^*}{\partial r_1}. \quad (12)$$

Two unknown MR parameters for the corresponding image point can be determined from the two Equations (9) and (10). In numerous applications, the parameters $\omega_2$, $[T_2^*]_1$ and $[T_2^*]_2$ can be viewed as at least approximately known. For example, these MR parameters in Equations (9) and (10) can be set equal to 0 when the echo times are very short in comparison to $[T_2^*]_1$ and $[T_2^*]_2$ and the frequency shift $\omega_2$ can be estimated depending on the temperature of the examination subject, for example. The latter is in particular approximately possible for hydrogen nuclear spins in water and adipose tissue.

In these or in other cases in which $\omega_2$, $[T_2^*]_1$ and $[T_2^*]_2$ can be viewed as at least approximately known, $\omega_{\Delta B0}$ and $r_1$ can be determined from Equations (9)-(12). This applies even when the conventional Dixon condition $\exp(i \cdot \omega_2 \cdot \square_n) = \pm 1$ is not satisfied since Equations (9)-(12) can be solved at least numerically even for phase differences between the spin species that are different than 0° and 180°.

Under the assumption that $(i \cdot \omega_2 \cdot \square_1) = 1$, $\exp(i \cdot \omega_2 \cdot \square_2) = -1$ and $[T_2^*]_1 \approx [T_2^*]_2$, the following closed solutions can be derived from Equations (9)-(12):

$$\mathrm{Exp}[2i\omega_{\Delta B0}(\tau_2 - \tau_1)] = \frac{\vec{d}_1^\dagger \vec{d}_2}{\vec{d}_2^\dagger \vec{d}_1}, \quad (13)$$

$$\xi = \frac{g_2 g_2 - g_1 g_1}{g_1 g_2} \quad (14)$$

$$= \frac{2(\vec{d}_2^\dagger \vec{d}_2 - \vec{d}_1^\dagger \vec{d}_1)}{\mathrm{Exp}[i\omega_{\Delta B0}(\tau_1 - \tau_2)]\vec{d}_1^\dagger \vec{d}_2 + \mathrm{Exp}[i\omega_{\Delta B0}(\tau_2 - \tau_1)]\vec{d}_2^\dagger \vec{d}_1},$$

wherein $$r_1 = \begin{cases} \frac{1}{2} + \frac{1}{4} e^{-(\tau_1 - \tau_2)/[T_2^*]_1} \left(\xi + \sqrt{4 + \xi^2}\right) & \text{if } \xi > 0, \\ \frac{1}{2} + \frac{1}{4} e^{-(\tau_1 - \tau_2)/[T_2^*]_1} \left(\xi - \sqrt{4 + \xi^2}\right) & \text{if } \xi < 0. \end{cases} \quad (15)$$

$\omega_{\Delta B0}$ can thereby initially be determined from Equation (13). $r_1$ can then be determined for the corresponding image point from Equations (14) and (15).

More than Two Echo Signals

For an MR data acquisition in which echo signals are respectively acquired at more than two echo times with multiple acquisition units so that the phase differences between the spin species is different at least two of the echo times, the extreme conditions of Equations (1) and (3) can be solved numerically. The echo sequence can be selected so that the phase differences between the spin species have different values at the multiple echo times M. A numerical determination of the MR parameters with an electronic computer from Equations (1) and (3) is possible even if the phase differences are not or not all equal to 0° or a whole number multiple of 180°.

Under the assumption that one of the echo times $(\tau_1)$ is equal to 0 or can be set equal to 0, heuristic solutions for the MR parameters can be derived. An echo time of $\tau_1 = 0$ can be achieved with spin echo sequences. In general, whenever the two $T_2^*$ times of the two spin species are similar and much greater than the echo time $\tau_1$ and when the difference $\omega_2$ of the precession frequencies of the two spin species is known so precisely that the spins of the first and second spin species are parallel at $\tau_1$, the echo time $\tau_1$ can be defined as a zero point in time, meaning that it can be set to $\tau_1 = 0$ so that all other echo times are measured relative to $\tau_1$. In the event that one of the echo times $(\tau_1)$ is equal to 0 or can be set equal to 0, it applies that $$g_n = \frac{\vec{d}_1^\dagger \vec{d}_n}{\vec{d}_1^\dagger \vec{d}_1} \exp(-i\omega_{\Delta B0}\tau_n). \quad (16)$$

Four Echo Signals with Different Phase Differences

For four echo signals with different phase differences, the extreme conditions according to Equations (1) and (3) can be further simplified using Equation (16). For example, the following expressions for the MR parameters $\omega_{\Delta B0}$, $[T_2^*]_1$ and $[T_2^*]_2$ can be derived for phase diffs between the spins of the first and second spin species at the four echo times that are approximately equal to 0°, 90°, 180° and 90°:

$$e^{2i\omega_{\Delta B0}\tau_3} = \frac{\vec{d}_1^\dagger \vec{d}_3}{\vec{d}_3^\dagger \vec{d}_1}, \quad (17)$$

$$\frac{e^{-\tau_4/[T_2^*]_1}}{e^{-\tau_2/[T_2^*]_1}} = \frac{\mathrm{Re}\left[\frac{\vec{d}_1^\dagger \vec{d}_4}{\vec{d}_1^\dagger \vec{d}_1} e^{-i\omega_{\Delta B0}\tau_4}\right]}{\mathrm{Re}\left[\frac{\vec{d}_1^\dagger \vec{d}_2}{\vec{d}_1^\dagger \vec{d}_1} e^{-i\omega_{\Delta B0}\tau_2}\right]}, \quad (18)$$

$$\frac{e^{-\tau_4/[T_2^*]_2}}{e^{-\tau_2/[T_2^*]_2}} = \frac{\mathrm{Im}\left[\frac{\vec{d}_1^\dagger \vec{d}_4}{\vec{d}_1^\dagger \vec{d}_1} e^{-i\omega_{\Delta B0}\tau_4}\right]}{-\mathrm{Im}\left[\frac{\vec{d}_1^\dagger \vec{d}_2}{\vec{d}_1^\dagger \vec{d}_1} e^{-i\omega_{\Delta B0}\tau_2}\right]}, \quad (19)$$

wherein in Equations (17)-(19) the MR parameters are in turn determined for one of the image points, and wherein the image point measurement value vectors $\vec{d}_n$ are indicated as in Equation (6) and have vector elements described with reference to FIG. 6, which vector elements correspond to the image point in the multiple image data that were acquired with the multiple acquisition units at the echo time $\tau_n$. In typical mathematical notation, the superscript dagger (†) designates the hermetic adjoint of the corresponding variable, i.e. the transpose and complex conjugate of the respective matrix or, respectively, of the respective vector.

Furthermore, the following equations for the MR parameter $r_1$ can be derived from the extreme conditions according to Equations (1) and (3):

$$r_1 = \mathrm{Re}\left[\frac{\frac{\vec{d}_1^\dagger \vec{d}_2}{\vec{d}_1^\dagger \vec{d}_1} e^{-i\omega_{\Delta B0}\tau_2} + ie^{-\tau_2/[T_2^*]_2}}{e^{-\tau_2/[T_2^*]_1} + ie^{-\tau_2/[T_2^*]_2}}\right], \quad (20)$$

$$r_1 = \mathrm{Re}\left[\frac{\frac{\vec{d}_1^\dagger \vec{d}_3}{\vec{d}_1^\dagger \vec{d}_1} e^{-i\omega_{\Delta B0}\tau_3} + e^{-\tau_3/[T_2^*]_2}}{e^{-\tau_3/[T_2^*]_1} + e^{-\tau_3/[T_2^*]_2}}\right] \text{ and} \quad (21)$$

$$r_1 = \mathrm{Re}\left[\frac{\frac{\vec{d}_1^\dagger \vec{d}_4}{\vec{d}_1^\dagger \vec{d}_1} e^{-i\omega_{\Delta B0}\tau_4} - ie^{-\tau_4/[T_2^*]_2}}{e^{-\tau_4/[T_2^*]_1} - ie^{-\tau_4/[T_2^*]_2}}\right]. \quad (22)$$

In the case of an MR data acquisition in which four echo signals are acquired with each of multiple acquisition units, such that the phase differences of the precessing spins of the first spin species and the second spin species are approximately equal to 0°, 90°, 180° and 90° at the four echo times, $\omega_{\Delta B0}$, $[T_2^*]_1$ and $[T_2^*]_2$ can be derived per pixel according to Equations (17)-(19).

The MR parameter $r_1$ can be derived from each of the Equations (20)-(22). The equation system for the extreme condition is over-determined. $r_1$ can thus be derived from each of the equations (20)-(22), for example. An averaging can subsequently take place. Alternatively, the different values for $r_1$ can be evaluated depending on the probability distribution, as was described with reference to Step 54 of the procedure from FIG. 3 or FIG. 5.

Three Echo Signals with Different Phase Differences

For three echo signals with different phase differences, the extreme conditions according to Equations (1) and (3) can be further simplified using Equation (16). For example, the following expressions for the MR parameters $\omega_{\Delta B0}$, $r_1$, $[T_2^*]_1$ and $[T_2^*]_2$ can be derived for phase differences between the spins of the first and second spin species at the three echo times that are approximately equal to 0°, 90° and 180°:

$$e^{2i\omega_{\Delta B0}\tau_3} = \frac{\vec{d}_1^\dagger \vec{d}_3}{\vec{d}_3^\dagger \vec{d}_1}, \quad (23)$$

$$r_1 = \text{Re}\left[\frac{\vec{d}_1^\dagger \vec{d}_2}{\vec{d}_1^\dagger \vec{d}_1}e^{-i\omega_{\Delta B0}\tau_2}\right]e^{\tau_2/[T_2^*]_1}, \quad (24)$$

$$\frac{\vec{d}_1^\dagger \vec{d}_3}{\vec{d}_1^\dagger \vec{d}_1}e^{-i\omega_{\Delta B0}\tau_3} = \text{Re}\left[\frac{\vec{d}_1^\dagger \vec{d}_2}{\vec{d}_1^\dagger \vec{d}_1}e^{-i\omega_{\Delta B0}\tau_2}\right]e^{\tau_2/[T_2^*]_1}e^{-\tau_3/[T_2^*]_1} - \quad (25)$$

$$\left(1 - \text{Re}\left[\frac{\vec{d}_1^\dagger \vec{d}_2}{\vec{d}_1^\dagger \vec{d}_1}e^{-i\omega_{\Delta B0}\tau_2}\right]e^{\tau_2/[T_2^*]_1}\right)e^{-\tau_3/[T_2^*]_2},$$

$$\text{Im}\left[\frac{\vec{d}_1^\dagger \vec{d}_2}{\vec{d}_1^\dagger \vec{d}_1}e^{-i\omega_{\Delta B0}\tau_2}\right] = \quad (26)$$

$$\pm\left(1 - \text{Re}\left[\frac{\vec{d}_1^\dagger \vec{d}_2}{\vec{d}_1^\dagger \vec{d}_1}e^{-i\omega_{\Delta B0}\tau_2}\right]e^{\tau_2/[T_2^*]_1}\right)e^{-\tau_2/[T_2^*]_2}.$$

In Equations (23)-(26) the MR parameters are determined in turn for one of the image points, wherein the image point measurement value vectors $\vec{d}_n$ have vector elements as indicated as in Equation (6) and described with reference to FIG. 6, which vector elements correspond to the image point in the multiple image data that were acquired with the multiple acquisition units at the echo time $\tau_n$.

$\omega_{\Delta B0}$ can be determined from Equation (23). The MR parameters $r_1$, $[T_2^*]_1$ and $[T_2^*]_2$ can then be determined using $\omega_{\Delta B0}$ determined in this manner.

Probability Distribution for Measured Data

MR image data that are respectively acquired with each of multiple acquisition devices at multiple echo times can thus be processed with methods and devices according to exemplary embodiments so that extreme conditions of a function that depends on the image data and the MR parameters are solved in order to determine the MR parameters. An example of such a function is indicated in Equation (5). Numerous corresponding functions can be indicated that lead to the same extreme conditions. For example, the function indicated in Equation (5) can be multiplied with prefactors independent of the MR parameters, or summands independent of MR parameters can be used without this leading to a change of the extreme conditions. The function indicated in Equation (5) is selected so that its extreme conditions approximately correspond to an extreme of a probability distribution for the image data. This is explained in detail in the following.

The signals acquired with M acquisition coils in total at N echo times in total can be represented in a vector with N·M vector elements of the form $$\vec{d} = \begin{pmatrix} d_{1,1} \\ \vdots \\ d_{M,1} \\ d_{1,2} \\ \vdots \\ d_{M,N} \end{pmatrix} = \begin{pmatrix} \vec{d}_1 \\ \vec{d}_2 \\ \vdots \\ \vec{d}_N \end{pmatrix}. \quad (27)$$

the image point measurement value vectors $\vec{d}_n$ are thereby defined as indicated in Equation (8).

The values reconstructed from the acquired data that are assembled in the vector $\vec{d}$ can be represented as a sum of a theoretically expected signal $\vec{s}$ and a noise term $\vec{n}$:

$$\vec{d} = \vec{s} + \vec{n}. \quad (28)$$

$$\vec{s} = \begin{pmatrix} s_{1,1} \\ \vdots \\ s_{M,1} \\ s_{1,2} \\ \vdots \\ s_{M,N} \end{pmatrix}, \quad (29)$$

is the case, wherein $$s_{m,n} = B_m \text{Exp}[i\omega_{\Delta B0}\tau_n]\sum_{l=1}^{L} r_l \text{Exp}[(-1/[T_2^*]_l + i\omega_l)\tau_n] \quad (30)$$

In Equation (30), l designates an index across different spin species. The variable $B_m$ is the sensitivity of the acquisition unit for the m-th acquisition channel.

In vector notation, the vector of theoretically expected signals according to Equation (29) can be represented as $$\vec{s} = G\vec{B} \quad (31)$$

with an N·M×N·M–matrix G.

$$\vec{B} = \begin{pmatrix} \vec{B}_1 \\ \vec{B}_2 \\ \vdots \\ \vec{B}_M \end{pmatrix} \quad (32)$$

is a vector with M vector elements, and $$G = \begin{pmatrix} \text{Exp}[i\omega_{\Delta B0}\tau_1]g_1 I \\ \text{Exp}[i\omega_{\Delta B0}\tau_2]g_2 I \\ \cdots \\ \text{Exp}[i\omega_{\Delta B0}\tau_n]g_n I \\ \cdots \\ \text{Exp}[i\omega_{\Delta B0}\tau_N]g_N I \end{pmatrix}, \quad (33)$$

wherein I is an M×M unit matrix. G thus has M columns and N·M lines. The mathematical simplification is a rescaling such that $$\vec{A} = T\vec{B} \text{ and} \quad (34)$$

$$G = HT, \quad (35)$$

wherein

-continued $$T = \left(\sum_{n=1}^{N} g_n g_n^*\right)^{\frac{1}{2}} I \text{ and} \quad (36)$$

$$H = \left(\sum_{n=1}^{N} g_N g_n^*\right)^{-\frac{1}{2}} \begin{pmatrix} \text{Exp}[i\omega_{\Delta B0}\tau_1]g_1 I \\ \text{Exp}[i\omega_{\Delta B0}\tau_2]g_2 I \\ \ldots \\ \text{Exp}[i\omega_{\Delta B0}\tau_n]g_n I \\ \ldots \\ \text{Exp}[i\omega_{\Delta B0}\tau_N]g_N I \end{pmatrix}. \quad (37)$$

In Equations (36) and (37), I in turn designates the M×M unit matrix. The variable $g_n$ is defined in Equation (6).

Using Equations (34)-(37), the noise vector $\vec{n}$ can be represented as $$\vec{n} = \vec{d} - H\vec{A}. \quad (38)$$

As explained, without limitation of generality it can be assumed that the covariance matrix of the vector $\vec{n}$ is a unit matrix. This can be achieved by measurement of the noise covariance matrix, diagonalization of the same and subsequent linear transformation and scaling of the MR raw data or image data. In this way the transformed and scaled data represent independent acquisition channels, wherein the variance in noise of the different acquisition channels is the same.

The conditional probability distribution for the image point measurement value vector $\vec{d}$ that conditionally depends on the expected noise-free data that can be comprised in the vector $\vec{s}$ is thus provided by $$P(\vec{d} \mid \vec{s}, C_n) = (2\pi)^{-NM} \text{Det}[C]^{-1} \text{Exp}\left[-\frac{1}{2}(\vec{d} - \vec{s})^\dagger C_n^{-1}(\vec{d} - \vec{s})\right] \quad (39)$$

$$= (2\pi)^{-NM} \text{Exp}\left[-\frac{1}{2}(\vec{d}^\dagger - \vec{A}^\dagger H^\dagger)(\vec{d} - H\vec{A})\right]$$

$$= (2\pi)^{-NM} \text{Exp}\left[-\frac{1}{2}\vec{d}^\dagger \vec{d}\right] \text{Exp}\left[-\frac{1}{2}(\vec{A}^\dagger \vec{A} - \vec{A}^\dagger H^\dagger \vec{d} - \vec{d}^\dagger H\vec{A})\right].$$

In Equation (39), $C_n$ designates the N·M×N·M covariance matrix of the noise vector. As noted, via linear transformation and scaling of the data that are provided by different acquisition units it can be achieved that $C_n$ is the N·M×N·M unit matrix.

The probability distribution according to Equation (39) depends on the matrix H and the vector $\vec{A}$. The vector $\vec{A}$ contains the sensitivities of the acquisition channels that are transformed according to Equation (34). These are in turn stochastic variables. A probability distribution for $\vec{A}$ is provided by $$P(\vec{A} \mid \vec{A_0}, C_A) = (2\pi)^{-M} \text{Det}[C_A]^{-1} \text{Exp}\left[-\frac{1}{2}(\vec{A} - \vec{A_0})^\dagger C_A^{-1}(\vec{A} - \vec{A_0})\right] \quad (40)$$

$$= (2\pi)^{-M} \text{Det}[C_A]^{-1} \text{Exp}\left[-\frac{1}{2}\vec{A_0}^\dagger C_A^{-1} \vec{A_0}^\dagger\right] \cdot$$

$$\text{Exp}\left[-\frac{1}{2}(\vec{A}^\dagger C_A^{-1} \vec{A} - \vec{A_0}^\dagger C_A^{-1} \vec{A} - \vec{A}^\dagger C_A^{-1} \vec{A_0})\right].$$

In Equation (40), $\vec{A_0}$ designates the expected value for the vector $\vec{A}$. $C_A$ designates the covariance matrix for $\vec{A}$.

According to the Bayesian theorem, the distribution for $\vec{d}$ according to Equation 39) can be represented as a conditional probability distribution $$P(\vec{d} \mid \vec{s}, c_n, \vec{A_0}, C_A) = \quad (41)$$

$$(2\pi)^{-(N+1)M} \text{Det}[C_A]^{-1} \text{Exp}\left[-\frac{1}{2}(\vec{d}^\dagger \vec{d} + \vec{A_0}^\dagger C_A^{-1} \vec{A_0}^\dagger)\right] \text{Exp}\Big[$$

$$-\frac{1}{2}(\vec{A}^\dagger (I + C_A^{-1})\vec{A} - \vec{A}^\dagger (H^\dagger \vec{d} + C_A^{-1} \vec{A_0}) - (\vec{d}^\dagger H + \vec{A_0}^\dagger C_A^{-1})\vec{A})\Big].$$

The exponent contains a term that is quadratic in the vector $\vec{A}$. Via quadratic expansion, the conditional probability distribution according to Equation (41) can be written as $$P(\vec{d} \mid \vec{A}, H, C_n, \vec{A_0}, C_A) = \quad (42)$$

$$(2\pi)^{-NM} \text{Det}[C_A]^{-1} \text{Exp}\left[-\frac{1}{2}(\vec{d}^\dagger \vec{d} + \vec{A_0}^\dagger C_A^{-1} \vec{A_0}^\dagger)\right](2\pi)^{-N} \text{Det}[D_A]^{-1}$$

$$\text{Exp}\left[-\frac{1}{2}(\vec{A} - \vec{\mu_A})^\dagger D_A^{-1}(\vec{A} - \vec{\mu_A})\right] \text{Det}[D_A] \text{Exp}\left[\frac{1}{2}\vec{\mu_A}^\dagger D_A^{-1} \vec{\mu_A}\right],$$

wherein $$\vec{\mu_A} = (I + C_A^{-1})^{-1}(H^\dagger \vec{d} + C_A^{-1} \vec{A_0}) \text{ and} \quad (43)$$

$$D_A = (I + C_A^{-1})^{-1}. \quad (44)$$

The vector $\vec{A}$ that contains sensitivities of the acquisition units transformed according to Equation (34) can be viewed as a statistical variable and can be integrated out in the probability distribution (42). Since the value depending on $\vec{A}$ in the exponent of Equation (42) has a quadratic form, the integral of all vectors $\vec{A}$ can be executed in a simple manner as is known. An effective probability distribution for the image point measurement value vector $\vec{d}$ results that is provided by $$P(\vec{d} \mid H, C_n, \vec{A_0}, C_A) = (2\pi)^{-NM} \text{Det}[C_A]^{-1} \quad (45)$$

$$\text{Det}[D_A] \cdot \text{Exp}\left[-\frac{1}{2}(\vec{d}^\dagger \vec{d} + \vec{A_0}^\dagger C_A^{-1} \vec{A_0}^\dagger - \vec{\mu_A}^\dagger D_A^{-1} \vec{\mu_A})\right].$$

The effective probability distribution over $\vec{\mu}_A$ is dependent on the MR parameters. In order to determine probable measurement results, the probability distribution indicated in Equation (45) is maximized. For this purpose, the logarithm of the probability distribution can be maximized. At maximum, the partial derivatives of the logarithm of the probability distribution according to Equation (45) must be equal to 0 according to the MR parameters. The MR parameters can be determined from the extreme conditions so that the probability distribution has a maximum for the actual acquired measurement values that are combined in the vector $\vec{d}$.

The covariance matrices $C_A$ and $D_A$ in Equation (45) are independent of the MR parameters to be determined, for example $\omega_{\Delta B0}$, $\omega_2$, $r_1$, $[T_2^*]_I$ and $[T_2^*]_2$. The extreme conditions can thus be represented so that $$\frac{\partial \text{Log}[P(\vec{d} \mid H, C_n, \vec{A_0}, C_A)]}{\partial X} = \frac{1}{2} \frac{\partial}{\partial X}(\vec{\mu_A}^\dagger D_A^{-1} \vec{\mu_A}) \quad (46)$$

$$= \frac{1}{2} \frac{\partial}{\partial X}\Big((H^\dagger \vec{d} + C_A^{-1} \vec{A_0})^\dagger (I + C_A^{-1})^{-1} \cdot$$

$$(H^\dagger \vec{d} + C_A^{-1} \vec{A_0})\Big)$$

is equal to 0 for all MR parameters $X=\omega_{\Delta B0}$, $\omega_2$, $r_1$, $[T_2^*]_I$ or $[T_2^*]_2$. Equations (43) and (44) were used again.

Under the realistic assumption that the term $H^\dagger \vec{d}$ varies more strongly with the MR parameters than $C_A^{-1}A_0$ and that $C_A^{-1}\vec{A}_0$ is small in comparison to $H^\dagger \vec{d}$, the partial derivative of Equation (46) can be approximated by $$\frac{\partial \text{Log}[P(\vec{d} \mid H, C_n, \vec{A}_0, C_A)]}{\partial X} = \frac{1}{2} \cdot (I + C_A^{-1})^{-1} \cdot \frac{\partial}{\partial X}(\vec{d}^\dagger HH^\dagger \vec{d}). \quad (47)$$

Using Equations (27) and (37), it follows that $$(\vec{d}^\dagger HH^\dagger \vec{d}) = \left(\sum_{n=1}^{N} g_n g_n^*\right)^{-1} \sum_{a=1}^{N}\sum_{b=1}^{N} \text{Exp}[i\omega_{\Delta B0}(\tau_a - \tau_b)]g_a g_b^* \vec{d}_a^\dagger \vec{d}_b. \quad (48)$$

The right side of Equation (48) is equal to the function defined in Equation (5). The extreme condition, that the partial derivatives in Equation (47) for all $X=\omega_{\Delta B0}$, $\omega_2$, $r_1$, $[T_2^*]_I$ or $[T_2^*]_2$ are equal to 0, corresponds to the condition that the partial derivatives of the function defined in Equation (5) according to $X=\omega_{\Delta B0}$, $\omega_2$, $r_1$, $[T_2^*]_I$ or $[T_2^*]_2$ are equal to 0. As noted, there are numerous mathematically equivalent formulations for this extreme condition. For example, the extreme condition can also be set up such that the probability distribution itself is extreme.

The condition that the partial derivative of the right side of Equation (48) according to $X=\omega_{\Delta B0}$ is equal to 0 leads to Equation (1). The condition that the partial derivatives of the right side according to $X=\omega_2$ $r_1$, $[T_2^*]_I$ or $[T_2^*]_2$ are equal to 0 leads to Equation (3). Depending on the number of MR parameters to be determined, not all extreme conditions must be evaluated.

While one form for $g_n$ for the special case of two spin species is indicated in Equation (2), the MR parameters for more than two spin species can also be determined from the extreme condition for the probability distribution. Equation (1) also applies for the case of more than two spin species. Equation (3) applies with the stipulation that it must be satisfied for the partial derivatives according to all MR parameters different than $\omega_{\Delta B}$. For the case of L spin species, the MR parameters are provided by the $T_2^*$ times $[T_2^*]_I, \ldots, [T_2^*]_L$, the precession frequencies $\omega_1, \ldots, \omega_L$ (wherein again one of the frequencies is arbitrarily established as a reference frequency and can be set equal to 0) and the local spin proportions $r_1, \ldots, r_L$ of the different spin species. Since the parameters $r_1, \ldots, r_L$ satisfy the constraint of Equation (7), for one of the spin species (spin species k) $r_k$ can be eliminated as a free parameter according to $$r_k = 1 - \sum_{l \neq k}^{L} r_l. \quad (49)$$

In this general case with L spin species, the partial derivatives for the variable $g_n$ that is defined in Equation (6) can thus be represented as $$\frac{\partial g_n}{\partial r_l} = \text{Exp}[(-1/[T_2^*]_l + i\omega_l)\tau_n] - \sum_{k \neq l}^{L} \text{Exp}[(-1/[T_2^*]_k + i\omega_k)\tau_n], \quad (50)$$

$$\frac{\partial g_n}{\partial \omega_l} = i\tau_n r_l \text{Exp}[(-1/[T_2^*]_l + i\omega_l)\tau_n]$$

and $$\frac{\partial g_n}{\partial [T_2^*]_l} = \frac{\tau_n}{[T_2^*]_l^2} r_l \text{Exp}[(-1/[T_2^*]_l + i\omega_l)\tau_n].$$

The partial derivatives of the complexly conjugated variable $g_n^*$ can be represented as $$\frac{\partial g_n^*}{\partial r_l} = \text{Exp}[(-1/[T_2^*]_l - i\omega_l)\tau_n] - \sum_{k \neq l}^{L} \text{Exp}[(-1/[T_2^*]_k - i\omega_k)\tau_n], \quad (51)$$

$$\frac{\partial g_n^*}{\partial \omega_l} = -i\tau_n r_l \text{Exp}[(-1/[T_2^*]_l - i\omega_l)\tau_n]$$

and $$\frac{\partial g_n^*}{\partial [T_2^*]_l} = \frac{\tau_n}{[T_2^*]_l^2} r_l \text{Exp}[(-1/[T_2^*]_l - i\omega_l)\tau_n].$$

An image point-by-image point procedure is possible in the determination of the MR parameters. The function indicated in Equation (5), and thus the Equations that represent its extreme conditions, depend on the image data combined in the vector $\vec{d}$ for the respective image point for which the MR parameters should be determined. The equations are independent of the values that other image points have in the M·N sets of image data. The equations described here accordingly apply to each of the image points of the image data.

Covariances and Evaluation

Not only the MR parameters for which the probability distribution is extreme can be determined from the probability distribution according to Equation (46), but also covariances between different variables (for example covariances between MR parameters) can be determined depending on the discovered MR parameters. This allows the influence of one of the MR parameters on another MR parameter to be quantified. Such information can be used to evaluate acquired data, for example within the scope of an error propagation. Such information can also be used to plan and implement MR data acquisitions.

As described with reference to Equation (4), covariances can be obtained via two-fold partial derivation of the logarithm of the probability distribution according to Equation (45). The resulting variable is evaluated at the maximum of the probability distribution (i.e. for the determined variables of the MR parameters) and for the acquired image data.

Complex image data that were acquired with multiple acquisition units and at multiple echo times can be combined with methods and devices according to exemplary embodiments such that MR parameters for an examination subject with multiple spin species can be determined with spatial resolution.

Various modifications can be realized in additional exemplary embodiments. For example, extreme conditions of various functions can be evaluated that can be derived from the probability distribution for the acquired image data in order to determine the MR parameters. While a few exemplary embodiments were described in the context of a data acquisition at an examination subject in which an MR imaging is implemented for spins of a first and second spin species, the exemplary embodiments can also be used for data acquisition if more than 2 spin species are present.

By the direct combination of the image data of various acquisition units and for various echo times, it can be achieved that a consistent solution is determined for the combination of the image data. The described methods and devices can be used in combination with an undersampling of k-space (ppa method). With methods and devices according to exemplary embodiments, the MR parameters can also be determined from the acquired image data if an echo sequence is implemented so that the spins of the different species are not directed in parallel or anti-parallel at one or more of the echo times. This allows an increased flexibility in the planning and implementation of Dixon measurements.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to process complex image data, comprising:
    providing, to a processor, complex image data, comprising phase and amplitude information, acquired as signals emitted from an examination subject during a plurality of echo times in a magnetic resonance (MR) data acquisition using a plurality of individual acquisition components selected from the group consisting of individual reception coils and respective portions of a multi-coil reception array, said complex image data having been acquired according to at least one MR parameter, of an MR data acquisition unit that executes said MR data acquisition, that affects said signals representing said complex image data, said examination subject comprising a first spin species and a second spin species that emit said signals, said second spin species differing from said first spin species, and a phase difference between precessing spins of said first spin species and precessing spins of said second spin species being different in at least two of said echo times; and
    in said processor, determining a value of said at least one MR parameter, with spatial resolution for a plurality of image points in said complex image data, that causes a function, which depends on said at least one MR parameter and a corresponding image point in said complex image data acquired during said at least two of said echo times, to satisfy an extreme condition at which said function has an extreme function value, by solving, for the multiple image points, an equation system that represents an extreme condition or multiple extreme conditions of a probability distribution depending on the at least one MR parameter, wherein the equation system represents the condition $$0 = \sum_{a=1}^{N}\sum_{b=1}^{N}(\tau_a - \tau_b)\mathrm{Exp}[i\omega_{\Delta B0}(\tau_a - \tau_b)]g_a g_b^* \vec{d}_a^{\dagger}\vec{d}_b \quad (1)$$

wherein N is a number of the echo times and $\tau_n$ represents the n-th echo time, wherein a vector $\vec{d}_n$ associated with the n-th echo time $\tau_n$ has matrix elements that depend on image data acquired with plurality of acquisition units at the echo time $\tau_n$, wherein $\omega_{\Delta B0}$ is a spatially resolved shift to be determined of a precession frequency, and wherein:

$$g_n = r_1 \mathrm{Exp}[(-1/[T_2^*]_1)\tau_n] + (1-r_1)\mathrm{Exp}[(-1/[T_2^*]_2 + i\omega_2)\tau_n] \quad (2)$$

wherein $r_1$ is the local proportion of the first spin species $[T_2^*]_2$ is the $T_2^*$ time of the first spin species, $[T_2^*]_2$ is the $T_2^*$ time of the second spin species, and $\omega_2$ is a difference between a precession frequency of the second spin species and a precession frequency of the first spin species; and making said value of said at least one MR parameter that causes said function to have said extreme function value available in electronic form at an output of said processor.

2. A method as claimed in claim 1 wherein the equation system furthermore represents the condition $$0 = \sum_{a=1}^{N}\sum_{b=1}^{N}\mathrm{Exp}[i\omega_{\Delta B0}(\tau_a - \tau_b)] \quad (3)$$

$$\left(\frac{\partial g_a}{\partial X_I}g_b^* + g_a\frac{\partial g_b^*}{\partial X_I} - \frac{\sum_{n=1}^{N}\left(\frac{\partial g_n}{\partial X_I}g_n^* + g_n\frac{\partial g_n^*}{\partial X_I}\right)}{\sum_{n=1}^{N}g_n g_n^*}g_a g_b^*\right)\vec{d}_a^{\dagger}\vec{d}_b$$

for at least one variable $X_1$ that is selected from $r_1$, $[T_2^*]_1$, $[T_2^*]_2$ and $\omega_2$.

3. A method as claimed in claim 1, comprising using the determined value for the at least one MR parameter in the probability distribution to identify an absolute maximum of the probability distribution.

4. A method as claimed in claim 1 comprising determining at least one of a variance of the at least one MR parameter and covariances of multiple parameters depending on the probability distribution.

5. A method as claimed in claim 1 comprising determining said at least one MR parameter by solving, for the multiple image points, an equation system comprising multiple equations that is independent of sensitivities of the acquisition units.

6. A method as claimed in claim 1 comprising determining said value of said at least one MR parameters as a product of a complex conjugate of an image point in image data acquired at, one of said at least two echo times, with one of the acquisition units, and the image point in additional image data acquired with said one of said acquisition units at another of said at least two echo times.

7. A method as claimed in claim 1 comprising providing said processor with the multiple complex image data that comprise:
    first complex image data acquired with a first acquisition unit at a first echo time among said at least two echo times;
    second complex image data acquired with the first acquisition unit at a second echo time among said at least two echo times;
    third complex image data acquired with a second acquisition unit at the first echo time;
    fourth complex image data acquired with the second acquisition unit at the second echo time; and
    combining the values for an image point in the first complex image data, the second complex image data, the third complex image data and the fourth complex image data simultaneously to determine the at least one MR parameter.

8. A method as claimed in claim 7 comprising determining the at least one MR parameter per image point.

9. A method as claimed in claim 8, comprising determining the at least one MR parameter for each image point independently of other image points in the complex image data.

10. A method as claimed in claim 1 comprising providing said processor with image data wherein the phase difference between the first spin species and the second spin species is different than k·180°, wherein k is a whole number or equal to zero, for at least one of the echo times.

11. A method as claimed in claim 10 wherein the phase difference between the first spin species and the second spin species is +90° or -90° for at least one of the echo times.

12. A method as claimed in claim 1 comprising selecting the at least one MR parameter determined with spatial resolution from the group consisting of a magnetic field inhomogeneity and a variable that quantifies a proportion of the first and/or second spin species.

13. A method as claimed in claim 1 comprising selecting the at least one MR parameter determined with spatial resolution from the group consisting of a magnetic field inhomogeneity and a variable that quantifies a proportion of the first and/or second spin species, and a $T_2^*$ of the first spin species and a $T_2^*$ time of the second spin species.

14. A method as claimed in claim 1 wherein the first spin species is hydrogen nuclei in water and the second spin species is hydrogen nuclei in adipose tissue.

15. A method for magnetic resonance imaging comprising:
operating a magnetic resonance (MR) data acquisition unit to acquire complex image data, comprising phase and amplitude information, as signals emitted from an examination subject during a plurality of echo times in an MR data acquisition using a plurality of individual acquisition components of the MR data acquisition unit selected from the group consisting of individual reception coils and respective portions of a multi-coil reception array, said complex image data being acquired according to at least one MR parameter of said MR data acquisition unit that affects said signals, representing said complex image data, said examination subject comprising a first spin species and a second spin species differing from said first spin species, and a phase difference between precessing spins of said first spin species and precessing spins of said second spin species being different in at least two of said echo times;
providing said complex image data to a processor and, in said processor, determining a value of said at least one MR parameter, with spatial resolution for a plurality of image points in said complex image data that causes a function, which depends on said at least one MR parameter and a corresponding image point in said complex image data acquired during said at least two of said echo times, to satisfy an extreme condition at which said function has an extreme function value, by solving, for the multiple image points, an equation system that represents an extreme condition or multiple extreme conditions of a probability distribution depending on the at least one MR parameter, wherein the equation system represents the condition $$0 = \sum_{a=1}^{N}\sum_{b=1}^{N}(\tau_a - \tau_b)\mathrm{Exp}[i\omega_{\Delta B0}(\tau_a - \tau_b)]g_a g_b * \vec{d}_a^\dagger \vec{d}_b \quad (1)$$

wherein N is a number of the echo times and $\tau_n$ represents the n-th echo time, wherein a vector $\vec{d}_n$ associated with the n-th echo time $\tau_n$ has matrix elements that depend on image data acquired with plurality of acquisition units at the echo time $\tau_n$, wherein $\omega_{\Delta B0}$ is a spatially resolved shift to be determined of a precession frequency, and wherein:

$$g_n = r_1 \mathrm{Exp}[(-1/[T_2^*]_1)\tau_n] + (1-r_1)\mathrm{Exp}[(-1/[T_2^*]_2 + i\omega_2)\tau_n] \quad (2)$$

wherein $r_1$ is the local proportion of the first spin species $[T_2^*]_1$ is the $T_2^*$ time of the first spin species, $[T_2^*]_2$ is the $T_2^*$ time of the second spin species, and $\omega_2$ is a difference between a precession frequency of the second spin species and a precession frequency of the first spin species; and
making said value of said at least one MR parameter that causes said function to have said extreme function value available in electronic form at an output of said processor.

16. A processor device for processing complex image data, comprising:
a processor input that receives complex image data, comprising phase and amplitude information, acquired as signals emitted from an examination subject during a plurality of echo times in a magnetic resonance (MR) data acquisition using a plurality of individual acquisition components of an MR data acquisition unit selected from the group consisting of individual reception coils and respective portions of a multi-coil reception array, according to at least one MR parameter of said MR data acquisition unit that affects said signals representing said complex image data, said examination subject comprising a first spin species and a second spin species that emit said signals, said second spin species differing from said first spin species, and a phase difference between precessing spins of said first spin species and precessing spins of said second spin species being different in at least two of said echo times;
said processor being configured to determine a value of said at least one MR parameter, with spatial resolution for a plurality of image points in said complex image data, that causes a function, which depends on said at least one MR parameter and a corresponding image point in said complex image data acquired during said at least two of said echo times, to satisfy an extreme condition at which said function has an extreme function value, by solving, for the multiple image points, an equation system that represents an extreme condition or multiple extreme conditions of a probability distribution depending on the at least one MR parameter, wherein the equation system represents the condition $$0 = \sum_{a=1}^{N}\sum_{b=1}^{N}(\tau_a - \tau_b)\mathrm{Exp}[i\omega_{\Delta B0}(\tau_a - \tau_b)]g_a g_b * \vec{d}_a^\dagger \vec{d}_b \quad (1)$$

wherein N is a number of the echo times and $\tau_n$ represents the n-th echo time, wherein a vector $\vec{d}_n$ associated with the n-th echo time $\tau_n$ has matrix elements that depend on image data acquired with plurality of acquisition units at the echo time $\tau_n$, wherein $\omega_{\Delta B0}$ is a spatially resolved shift to be determined of a precession frequency, and wherein:

$$g_n = r_1 \mathrm{Exp}[(-1/[T_2^*]_1)\tau_n] + (1-r_1)\mathrm{Exp}[(-1/[T_2^*]_2 + i\omega_2)\tau_n] \quad (2)$$

wherein $r_1$ is the local proportion of the first spin species $[T_2^*]_1$ is the $T_2^*$ time of the first spin species, $[T_2^*]_2$ is the $T_2^*$ time of the second spin species, and $\omega_2$ is a difference between a precession frequency of the second spin species and a precession frequency of the first spin species; and said processor being configured to make said value of said at least one MR parameter that causes said function to have said extreme function value available in electronic form at an output of said processor.

17. A magnetic resonance imaging system, comprising:

a magnetic resonance (MR) data acquisition unit comprising a plurality of individual acquisition components, selected from the group consisting of individual reception coils and respective portions of a multi-coil reception array that respective acquire complex image data, comprising phase and amplitude information;

a processor configured to operate said MR data acquisition unit to acquire complex image data as signals emitted from an examination subject during a plurality of echo times in an MR data acquisition using said plurality of individual acquisition components, according to at least one MR parameter of said MR data acquisition unit that affects said signals representing said complex image data, acquired in said MR data acquisition, said examination subject comprising a first spin species and a second spin species that emit said signals, said second spin species differing from said first spin species, and a phase difference between precessing spins of said first spin species and precessing spins of said second spin species being different in at least two of said echo times; and said processor being supplied with said complex image data and being configured to determine a value of said at least one MR parameter, with spatial resolution for a plurality of image points in said complex image data, that causes a function, which depends on said at least one MR parameter and a corresponding image point in said complex image data during said at least two of said echo times, to satisfy an extreme condition at which said function has an extreme function value by solving, for the multiple image points, an equation system that represents an extreme condition or multiple extreme conditions of a probability distribution depending on the at least one MR parameter, wherein the equation system represents the condition $$0 = \sum_{a=1}^{N}\sum_{b=1}^{N}(\tau_a - \tau_b)\mathrm{Exp}[i\omega_{\Delta B0}(\tau_a - \tau_b)]g_a g_b * \vec{d}_a^\dagger \vec{d}_b \quad (1)$$

wherein N is a number of the echo times and $\tau_n$ represents the n-th echo time, wherein a vector $\vec{d}_n$ associated with the n-th echo time $\tau_n$ has matrix elements that depend on image data acquired with plurality of acquisition units at the echo time $\tau_n$, wherein $\omega_{\Delta B0}$ is a spatially resolved shift to be determined of a precession frequency, and wherein:

$$g_n = r_1 \mathrm{Exp}[(-1/[T_2^*]_1)\tau_n] + (1-r_1)\mathrm{Exp}[(-1/[T_2^*]_2 + i\omega_2)\tau_n] \quad (2)$$

wherein $r_1$ is the local proportion of the first spin species $[T_2^*]_1$ is the $T_2^*$ time of the first spin species, $[T_2^*]_2$ is the $T_2^*$ time of the second spin species, and $\omega_2$ is a difference between a precession frequency of the second spin species and a precession frequency of the first spin species; and said processor being configured to make said value of said at least one MR parameter that causes said function to have said extreme function value available in electronic form at an output of said processor.

18. A non-transitory computer-readable data storage medium encoded with programming instructions, said data storage medium being loaded into a computerized control and evaluation system of a magnetic resonance (MR) imaging system, and said programming instructions causing said computerized control and evaluation system to:

operate an MR data acquisition unit of the MR imaging system to acquire complex image data, comprising phase and amplitude information, as signals emitted from an examination subject during a plurality of echo times in an MR data acquisition using a plurality of individual acquisition components of the MR data acquisition unit selected from the group consisting of individual reception coils and respective portions of a multi-coil reception array, according to at least one MR parameter of the MR data acquisition unit that affects said signals representing said complex image data, said examination subject comprising a first spin species and a second spin species that emit said signals, said second spin species differing from said first spin species, and a phase difference between precessing spins of said first spin species and precessing spins of said second spin species being different in at least two of said echo times;

determine a value of said at least one MR parameter, with spatial resolution for a plurality of image points in said complex image data, that causes a function, which depends on said at least one MR parameter and a corresponding image point in said complex image data during said at least two of said echo times, to satisfy an extreme condition at which said function has an extreme function value (a) by solving, for the multiple image points, an equation system that represents an extreme condition or multiple extreme conditions of a probability distribution depending on the at least one MR parameter, wherein the equation system represents the condition $$0 = \sum_{a=1}^{N}\sum_{b=1}^{N}(\tau_a - \tau_b)\mathrm{Exp}[i\omega_{\Delta B0}(\tau_a - \tau_b)]g_a g_b * \vec{d}_a^\dagger \vec{d}_b \quad (1)$$

wherein N is a number of the echo times and $\tau_n$ represents the n-th echo time, wherein a vector $\vec{d}_n$ associated with the n-th echo time $\tau_n$ has matrix elements that depend on image data acquired with plurality of acquisition units at the echo time $\tau_n$, wherein $\omega_{\Delta B0}$ is a spatially resolved shift to be determined of a precession frequency, and wherein:

$$g_n = r_1 \mathrm{Exp}[(-1/[T_2^*]_1)\tau_n] + (1-r_1)\mathrm{Exp}[(-1/[T_2^*]_2 + i\omega_2)\tau_n] \quad (2)$$

wherein $r_1$ is the local proportion of the first spin species $[T_2^*]_1$ is the $T_2^*$ time of the first spin species, $[T_2^*]_2$ is the $T_2^*$ time of the second spin species, and $\omega_2$ is a difference between a precession frequency of the second spin species and a precession frequency of the first spin species; and make said value of said at least one MR parameter that causes said function to have said extreme function value available in electronic form at an output of said processor.

* * * * *